US 8,174,910 B2

(12) United States Patent
Sato

(10) Patent No.: US 8,174,910 B2
(45) Date of Patent: May 8, 2012

(54) SEMICONDUCTOR DEVICE AND SYSTEM FOR SWITCHING BETWEEN HIGH-VOLTAGE AND LOW-VOLTAGE OPERATION CIRCUITS

(75) Inventor: Takahiko Sato, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 229 days.

(21) Appl. No.: 12/631,520

(22) Filed: Dec. 4, 2009

(65) Prior Publication Data

US 2010/0157697 A1    Jun. 24, 2010

(30) Foreign Application Priority Data

Dec. 19, 2008    (JP) .................................. 2008-324427

(51) Int. Cl.
    *G11C 7/00*    (2006.01)
(52) U.S. Cl. .............. 365/189.11; 365/226; 365/230.08; 326/80; 326/81
(58) Field of Classification Search ............. 365/189.11, 365/226, 230.08; 326/80, 81
    See application file for complete search history.

(56) References Cited

U.S. PATENT DOCUMENTS

| 6,087,851 A | 7/2000 | Kim et al. |
| 6,838,908 B2 * | 1/2005 | Ker et al. .......................... 326/83 |
| 6,943,587 B2 * | 9/2005 | Joshi et al. ....................... 326/80 |
| 2008/0137465 A1 * | 6/2008 | Katayama ...................... 365/226 |

FOREIGN PATENT DOCUMENTS

| JP | 07-022937 A | 1/1995 |
| JP | 3016993 B2 | 12/1999 |
| JP | 2006-252769 A | 9/2006 |
| JP | 2008-085876 A | 4/2008 |

* cited by examiner

*Primary Examiner* — Connie Yoha
(74) *Attorney, Agent, or Firm* — Arent Fox LLP

(57) ABSTRACT

A semiconductor device includes a first input circuit to which a first supply voltage is supplied, a second input circuit to which a second supply voltage that is lower than the first supply voltage is supplied, and a control circuit which activates the first input circuit in a first mode and activates the second input circuit in a second mode. The control circuit controls the first input circuit and the second input circuit such that the first input circuit and the second input circuit are activated during a certain time period when switching between the first mode and the second mode.

17 Claims, 18 Drawing Sheets

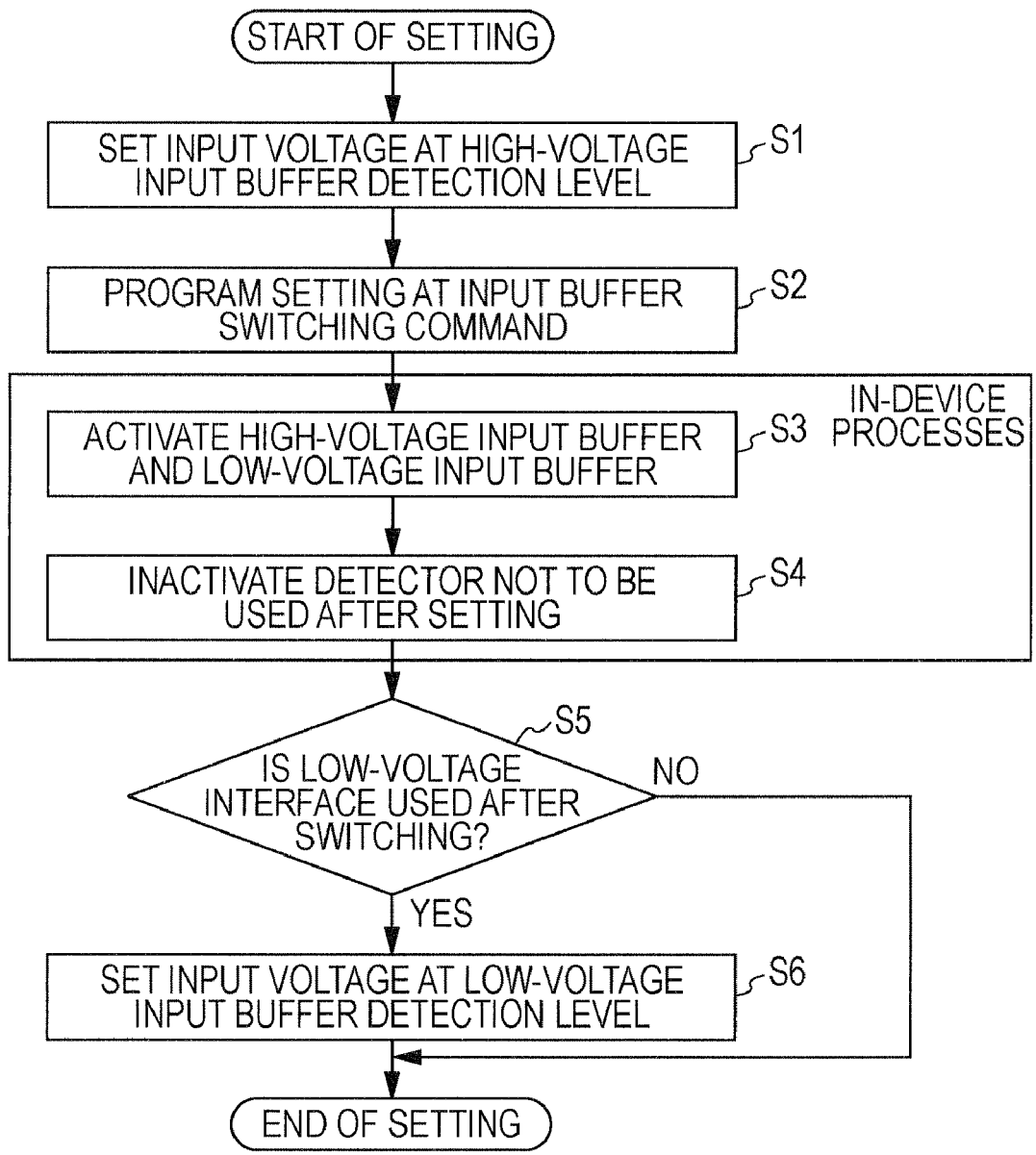

SEMICONDUCTOR DEVICE AND SYSTEM FOR SWITCHING BETWEEN HIGH-VOLTAGE AND LOW-VOLTAGE OPERATION CIRCUITS

CROSS-REFERENCE TO RELATED APPLICATIONS

This application claims the benefit of priority from Japanese Patent Application No. 2008-324427 filed on Dec. 19, 2008, the entire contents of which are incorporated herein by reference.

BACKGROUND

1. Field

Embodiments discussed herein relate to a semiconductor device.

2. Description of Related Art

A semiconductor chip of the latest model has various functions and is manufactured at a low cost. Therefore, it is desirable that the semiconductor chip's functions be changed after manufacture in accordance with a software-like program prepared for a hardware product. In addition, it is desirable that an interface part of a semiconductor integrated circuit perform at a necessary processing speed by driving it at a high voltage and a high speed when activated and consumption power be decreased by driving it at a low voltage and a low speed in a standby state. For example, an input buffer where a high-voltage operation circuit for a high-speed operation and a low-voltage operation circuit for a low-speed operation are switched is provided and switching operating voltages by software control is performed. A high-voltage operation or a low-voltage operation may be selected based on an MRS command (Mode Register Set command).

Related techniques are described in Japanese Laid-Open Patent Publication No. 2006-252769, Japanese Laid-Open Patent Publication No. H7-22937, Japanese Laid-Open Patent Publication No. 2008-85876 and Japanese Patent No. 3016993.

SUMMARY

According to one aspect of the disclosure, a semiconductor device includes a first input circuit to which a first supply voltage is supplied, a second input circuit to which a second supply voltage that is lower than the first supply voltage is supplied, and a control circuit which activates the first input circuit in a first mode and activates the second input circuit in a second mode. The control circuit controls the first input circuit and the second input circuit such that the first input circuit and the second input circuit are activated during a certain time period when switching between the first mode and the second mode.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 18 illustrates an exemplary signal voltage adjustment and an exemplary operation mode switching.

DESCRIPTION OF EMBODIMENTS

If switching of input buffers is performed in software based on an MRS command, switching may be performed while a device is being operated. If a timing at which an output signal from an input buffer before switching shifts from a timing at which an output signal from an input buffer after switching, signal supply from the input buffers to an internal circuit may be instantaneously interrupted. For example, such a situation may occur that signal supply from an input buffer to the internal circuit before switching is interrupted and signal supply from an input buffer to the internal circuit after switching is not yet performed.

In the figures, dimensions and/or proportions may be exaggerated for clarity of illustration. It will be understood that when an element is referred to as being "between" two elements, it may be the only element layer between the two elements, or one or more intervening elements may also be present.

Figure 1:
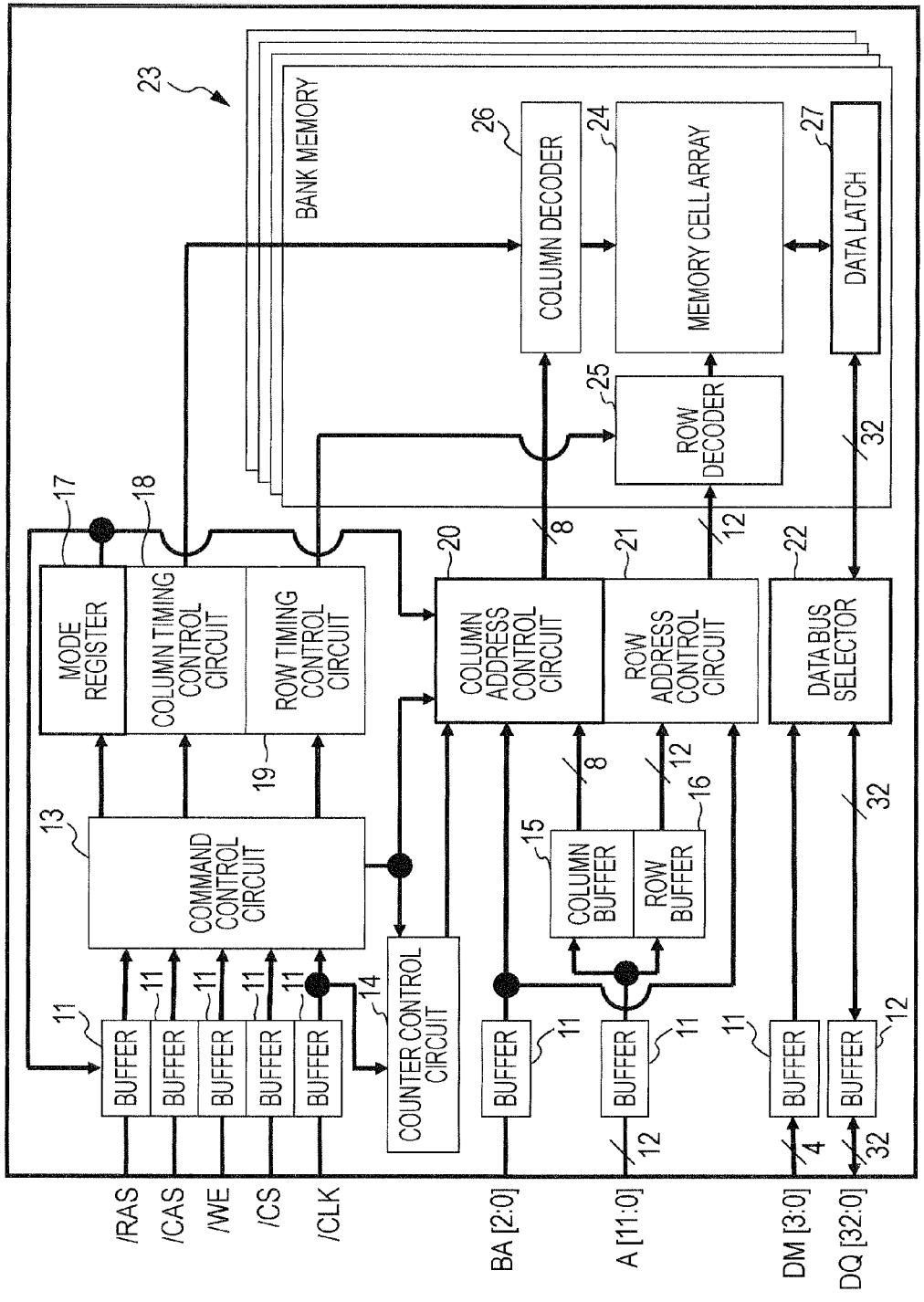
FIG. 1 illustrates an exemplary semiconductor storage device.

FIG. 1 illustrates an exemplary semiconductor storage device. The semiconductor storage device illustrated in FIG. 1 performs switching of input buffers. The semiconductor storage device may include a Synchronous Dynamic Random Access Memory (SDRAM) interface.

A semiconductor storage device 10 includes a plurality of input buffers 11 corresponding to a plurality of input signals, a plurality of input/output buffers 12 corresponding to data signals, a column buffer 15 and a row buffer 16. The semiconductor storage device 10 also includes a command control circuit 13, a counter control circuit 14, a mode register 17, a column timing control circuit 18, a row timing control circuit 19, a column address control circuit 20, a row address control circuit 21 and a data bus selector 22. The semiconductor storage device 10 further includes a plurality of memory banks 23.

Configurations of respective memory banks 23 may be substantially the same as or similar to one another. Each of the memory banks 23 includes a memory cell array 24, a row decoder 25, a column decoder 26 and a data latch 27. One of the memory banks 23 is designated based on a result of decoding of a bank address BA[2:0].

The input buffers 11 receive address signals including an address signal A[11:0] and the bank address BA [2:0] from the outside. The input buffers 11 receive control signals such as a chip select signal /CS, a row address strobe signal /RAS, a column address strobe signal /CAS, a write enable signal /WE, a clock signal /CLK and a byte mask signal DM[3:0] from the outside. Each of the input/output buffers 12 receives a data signal DQ[32:0] from the outside and sends the data signal DQ[32:0] to the outside. X[y:z] indicates that bits ranging from the z-th bit to the y-th bit are included in a signal X. Signals received by the input buffers 11 are supplied from the respective input buffers 11 to the respective circuits. Although not illustrated in the drawing, supply voltages vddh and vddl and a ground voltage may be supplied from the outside to the semiconductor storage device 10.

The command control circuit 13 receives a control signal, such as, the chip select signal /CS, the row address strobe signal /RAS, the column address strobe signal /CAS or the write enable signal /WE. The command control circuit 13 decodes the received control signal to generate a control signal based on a result of decoding of the received control signal. The generated control signal is supplied to, for example, the column timing control circuit 18, the row timing control circuit 19 and the mode register 17. For example, the command control circuit 13 supplies a signal mrspz used to set an operation mode such as a high-voltage operation mode or a low-voltage operation mode to the mode register 17.

Each of the column timing control circuit 18 and the row timing control circuit 19 generates a timing signal corresponding to a read operation or a write operation based on the control signal and a clock signal CLK from the command control circuit 13. The generated timing signal is supplied to the corresponding memory bank 23. Operations at respective circuits are executed based on the supplied timing signal.

The column address control circuit 20 receives the bank address from the input buffer 11 for the bank address (hereinafter, referred to as the bank address input buffer) and a column address from the column buffer 15. The column address control circuit 20 controls the memory bank 23 based on the received addresses to select a bank or a column. The column address control circuit 20 controls burst access based on a burst address generated under the control of the counter control circuit 14. The row address control circuit 21 receives the bank address from the bank address input buffer 11 and a row address from the row buffer 16. The row address control circuit 21 controls the memory banks 23 based on the received addresses and selects a bank or a row, for example, a word.

The memory cell array 24 includes a cell array. The cell array includes a plurality of memory cells arranged in a matrix in row and column directions. Data is stored in each memory cell. In the memory cell array 24, a plurality of word lines are arranged corresponding to a plurality of row addresses and the plurality of memory cells are coupled to the respective word lines. Each of the word lines is coupled to the row decoder 25. A plurality of bit lines are arranged in a column address direction and a sense amplifier is coupled to each bit line. A column address is selected based on a column selection line extending from the column decoder 26.

The row decoder 25 is controlled by the row timing control circuit 19 and the row address control circuit 21 to activate a word line which is designated based on a row address. The column decoder 26 is controlled by the column timing circuit 18 and the column address control circuit 20 to activate a column selection line designated based on the selected column address.

The data in a memory cell coupled to the activated word line is read into a bit line and is amplified by the sense amplifier. In a read operation, the data which is amplified by the sense amplifier is selected by the activated column selection line and is output from the input/output buffer 12 for the data signal DQ (hereinafter, referred to as the DQ input/output buffer 12) to the outside of the semiconductor storage device via the data latch 27 and the data bus selector 22. In a write operation, write data is supplied from the outside of the semiconductor storage device via the DQ input/output buffer 12, the data bus selector 22 and the data latch 27 and is written into the sense amplifier corresponding to the column address selected by the activated column selection line. The write data and the read data from the memory cell are written into the memory cell coupled to the activated word line.

Figure 2:
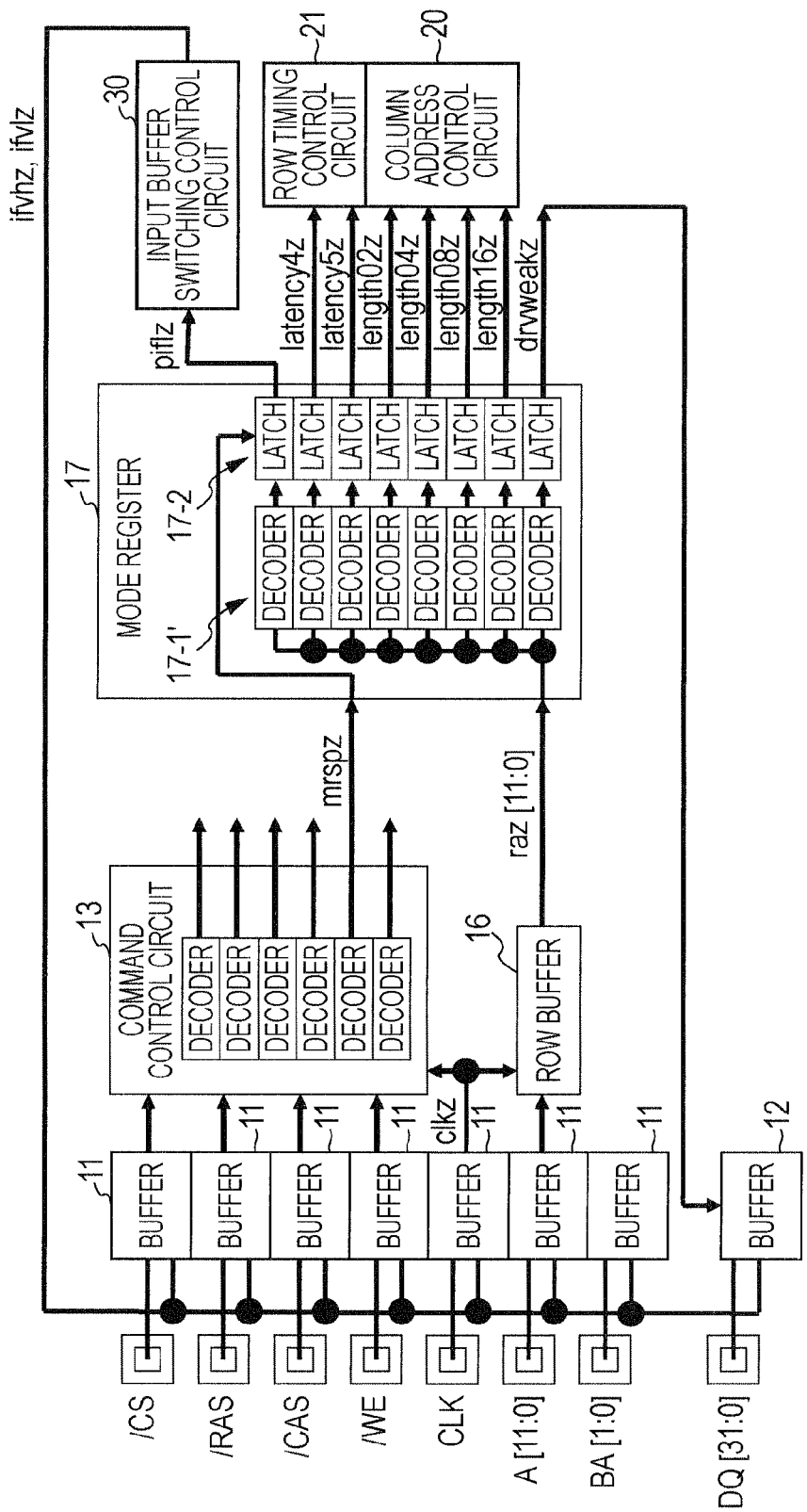
FIG. 2 illustrates an exemplary input buffer switching control.

FIG. 2 illustrates an exemplary input buffer switching control. The input buffer switching control illustrated in FIG. 2 may be executed by the mode register 17 illustrated in FIG. 1. In FIG. 2, the same numerals are assigned to the same elements as those illustrated in FIG. 1 and description thereof will be omitted or reduced. The mode register is set based on the resister setting command MRS. For example, the register setting command MRS where all the signals /CS, /RAS, /CAS and /WE are set low (LOW) is input into the mode register 17 and a code for setting an operation or a function is supplied to an address terminal as the address signal A[11:0]. In response to the register setting command MRS, the mode register setting signal mrspz, which is one of decode output signals output from the command control circuit 13, is asserted. Other decode signals output from the command control circuit 13 may be supplied to the column timing control circuit 18 and the row timing control circuit 19 as control signals.

When the mode register setting signal mrspz is asserted, an internal register of an address signal raz[11:0] corresponding to the address signal A[11:0] is set in the mode register 17. The address signal raz[11:0] may be logically the same as the address signal A[11:0]. Results of decoding of the address signal raz[11:0] by a plurality of decoders 17-1 are stored in a plurality of corresponding latches 17-2. Data storage into the latches 17-2 is performed in response to assertion of the mode register setting signal mrspz.

A signal pifls which is one of setting signals output from the latches 17-2 is supplied to an input buffer switching control circuit 30. The input buffer switching control circuit 30 switches between a high-voltage operation mode and a low-voltage operation mode of the input buffers 11. Signals latency4z and latency5z of the setting signals output from the latches 17-2 are supplied to the row address control circuit 21. The setting signals latency4z and latency5z set the latencies of the semiconductor storage device 10. Signals length02z and length16z of the setting signals output from the latches 17-2 are supplied to the column address control circuit 20. The setting signals length02z and length16z set the length of a burst. A signal drvweakz which is one of the setting signals output from the latches 17-2 is supplied to the input/output buffer 12. The setting signal drvweakz sets an output data driving power of the input/output buffer 12.

The input buffer switching control circuit 30 asserts a high-voltage operation command signal ifvhz or a low-voltage operation command signal ifvlz in response to the signal piflz. The high-voltage operation command signal ifvhz and the low-voltage operation command signal ifvlz are supplied to the input buffers 11 and the input/output buffer 12. In the input buffer 11 and the input/output buffers 12, an input buffer for the high-voltage operation or an input buffer for the low-voltage operation is selected in accordance with the operation command signal.

Figure 3:
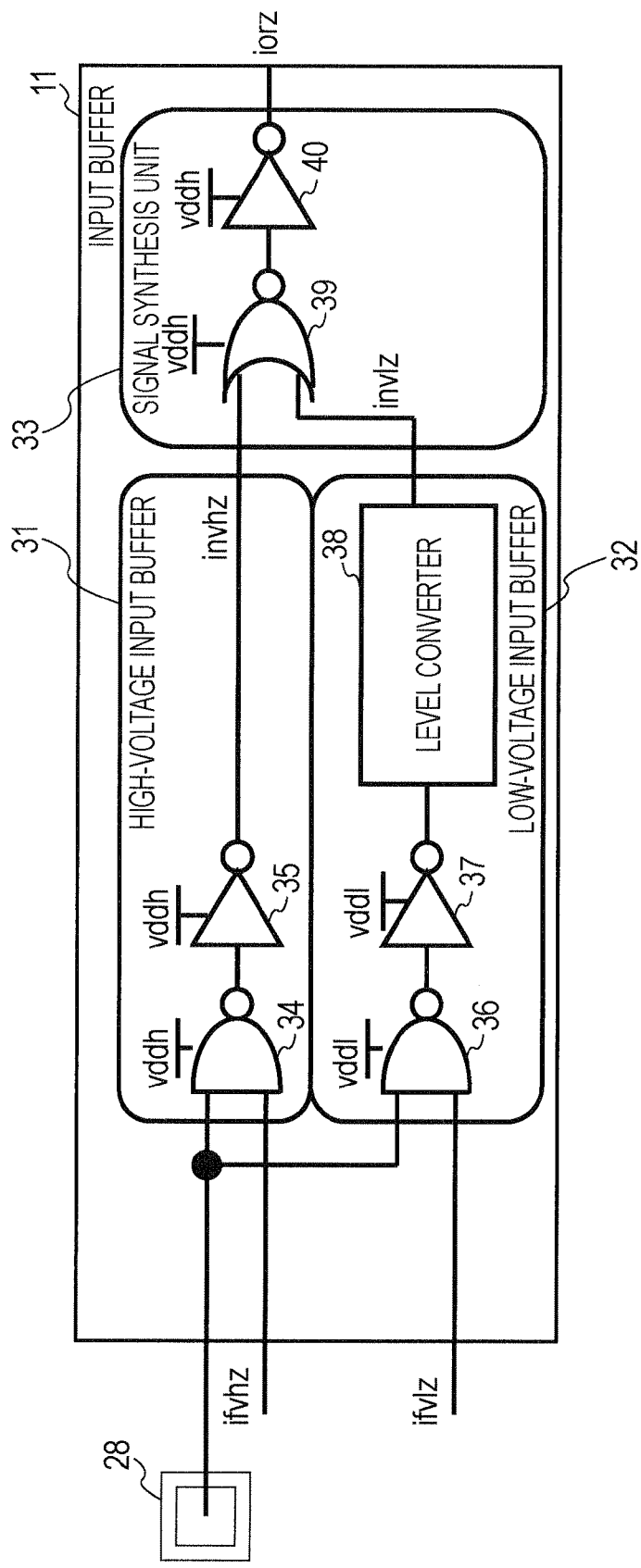
FIG. 3 illustrates an exemplary input buffer.

FIG. 3 illustrates an exemplary input buffer. The input buffer illustrated in FIG. 3 may be the input buffer 11 illustrated in FIG. 1 or 2. The input section of the input/output buffer 12 illustrated in FIG. 1 may be substantially the same as or similar to the input section of the input buffer illustrated in FIG. 3. The input buffer 11 includes an input buffer 31 for the high-voltage operation (hereinafter, referred to as a high-voltage input buffer), an input buffer 32 for the low-voltage operation (hereinafter, referred to as a low-voltage input buffer) and a signal synthesis unit 33. A first supply voltage vddh is supplied to the high-voltage input buffer 31 and a second supply voltage vddl which is lower than the first supply voltage vddh is supplied to the low-voltage input buffer 32. For example, the input buffer switching control circuit 30 illustrated in FIG. 12 asserts the high-voltage operation command signal ifvhz in a first mode to activate the high-voltage input buffer 31 and asserts the low-voltage operation command signal ifvlz in a second mode to activate the low-voltage input buffer 32. The input buffer switching control circuit 30 controls the high-voltage input buffer 31 and the low-voltage input buffer 32 such that there is a time period when the high-voltage input buffer 31 and the low-voltage input buffer 32 are contemporaneously activated when switching between the first mode and the second mode. The signal synthesis unit 33 synthesizes an output signal invhz from the high-voltage input buffer 31 and an output signal invlz from the low-voltage input buffer 32 to generate an output signal iorz. The output signal iorz may have the same logic as an input signal supplied to an input terminal 28 of the input buffer and is supplied to an internal circuit as an input signal.

The high-voltage input buffer 31 includes a NAND gate 34 and an inverter 35 that operate at the first supply voltage vddh. The high-voltage operation command signal ifvhz is input into one of inputs of the NAND gate 34 and the input signal sent from the input terminal 28 is input into the other input of the NAND gate 34. When the high-voltage operation command signal is at a high level, the input signal sent from the input terminal 28 passes through the NAND gate 34 and the inverter 35 and is supplied to the signal synthesis unit 33 as the signal invhz. The high-voltage input buffer 31 operates at the relatively high supply voltage vddh, so that data is input at a high speed and hence the consumption power may be increased accordingly. When the high-voltage operation command signal is at a low level, signal level transition does not occur within the high-voltage input buffer 31 and hence the power is not consumed.

The low-voltage input buffer 32 includes a NAND gate 36, an inverter 37 and a level converter 38 that operate at the second supply voltage vddl. The low-voltage operation command signal ifvlz is input into one of inputs of the NAND gate 36 and the input signal sent from the input terminal 28 is input into the other input of the NAND gate 36. When the low-voltage operation command signal is at a high level, the input signal from the input terminal 28 passes through the NAND gate 36, the inverter 37 and the level converter 38 and is supplied to the signal synthesis unit 33 as the signal invlz. The low-voltage input buffer 32 operates at the relatively low supply voltage vddl, so that data is input at a low speed and hence the consumption power is decreased accordingly. When the low-voltage operation command signal ifvlz is at a low level, signal level transition does not occur within the low-voltage input buffer 32 and hence the power is not consumed. The level converter 38 converts a signal (a signal that changes within a range from the ground voltage to the voltage vddl) of the second supply voltage vddl to a signal (a signal that changes within a range from the ground voltage to the voltage vddh) of the first supply voltage vddh.

The signal synthesis unit 33 includes an NOR gate 39 and an inverter 40. The NOR gate 39 and the inverter 40 generate OR logic. A result of OR operation performed on the signals invhz and invlz is output as the output signal iorz.

In the input buffer 11 illustrated in FIG. 3, the low-voltage input buffer 32 includes the level converter 38. Thus, output of the output signal invlz from the low-voltage input buffer 32 is delayed from output of the output signal invhz from the high-voltage input buffer 31. When the high-voltage input buffer 31 and the low-voltage input buffer 32 are activated and the input signal from the input terminal 28 shifts, the output signal invhz shifts first and then the output signal invlz changes after a given delay time elapses. For example, if a high signal is supplied to the input terminal 28, the high-voltage input buffer 31 and activation of the low-voltage input buffer 32 may be contemporaneously activated. Although the output signal invhz is set at a low level based on inactivation of the high-voltage input buffer 31, the output signal invlz to be output based on activation of the low-voltage input buffer 32 is set at a high level delayed by the delay time of the level converter 38. Thus, the output signal invlz is held at a low level, that is, in an inactive state. When the operation mode is shifted from the high-voltage operation mode to the low-voltage operation mode, the output signal iorz is set to a signal which is not derived from a signal of the input terminal 28 such as, for example, a LOW signal. If the signal is supplied to the internal circuit, the internal circuit may malfunction. For example, if an erroneous signal is supplied from the control signal input buffer 11 illustrated in FIG. 2 to the command control circuit 13, the command control circuit 13 may output an erroneous decoding result. For example, if an erroneous signal is output from the input buffer 11 for the clock signal CLK, a malfunction may occur in each control circuit.

The time period when the high-voltage input buffer 31 and the low-voltage input buffer 32 are contemporaneously activated is provided when being switched from the first mode, where the high-voltage input buffer 31 is used, to the second mode where the low-voltage input buffer 32 is used. For example, a time period when the high-voltage operation command signal ifvhz and the low-voltage operation command signal ifvlz are contemporaneously asserted is provided. The number of the input buffers to be switched is not limited to two and switching may be conducted among three or more input buffers and a single input buffer may be selected.

Figure 4:
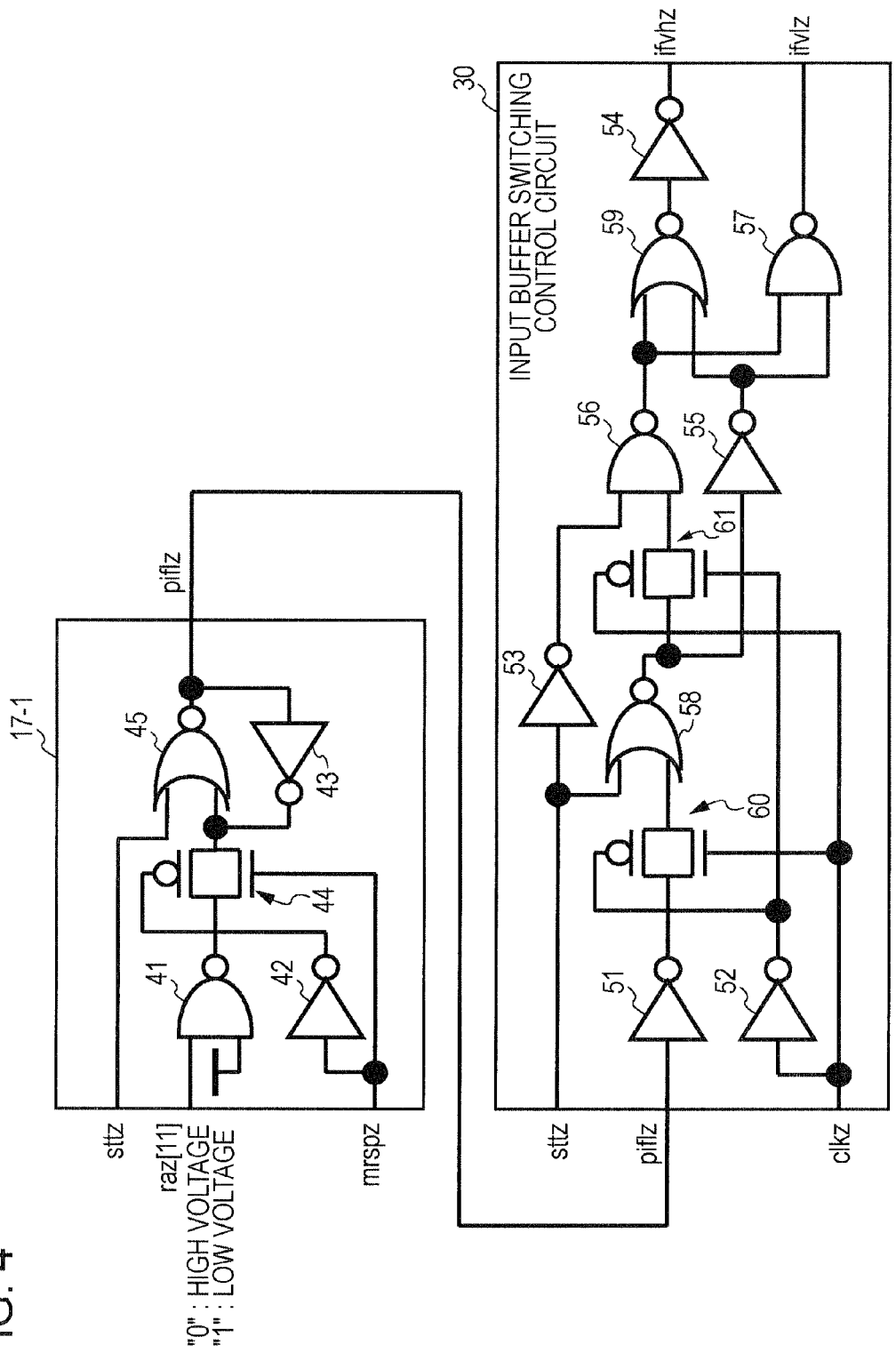
FIG. 4 illustrates an exemplary input buffer switching control circuit and an exemplary mode register.

FIG. 4 illustrates an exemplary input buffer switching control circuit and an exemplary mode register. The input buffer switching control circuit and the mode register illustrated in FIG. 4 may be the input buffer switching control circuit 30 and the mode register 17 illustrated in FIG. 2. The mode register 17 generates a signal piflz to be supplied to the input buffer switching control circuit 30. The mode register 17 includes a mode register circuit 17-1. The mode register circuit 17-1 may generate the signal piflz. The mode register circuit 17-1 includes a NAND gate 41, inverters 42 and 43, a transmission gate 44 and an NOR gate 45. The high-voltage operation mode or the low-voltage operation mode is designated based on a one-bit signal raz[11] of the address signal raz[11:0] which is logically the same as the input address signal A[11:0]. The NOR gate 45 and the inverter 43 constitute a one-bit latch. A signal sttz may be a power-on-reset signal and is set at a high level when the power source is turned on and set at a low level after the power source is turned on. The latch is reset based on the power-on-reset signal sttz such that the signal piflz is set at a low level after the power source is turned on.

A mode register setting signal mrspz which is one of decode output signals supplied from the command control circuit 13 is asserted in response to input of the register setting command MRS. When the mode register setting signal mrspz is asserted, for example, the transmission gate 44 of the mode register circuit 17-1 illustrated in FIG. 4 conducts and hence the signal piflz which is at the same level as the address signal raz[11] is output. The NAND gate 41 may be part of the decoder 17-1' illustrated in FIG. 2. The latch may correspond to one of the latches 17-2 illustrated in FIG. 2. The signal piflz is supplied to the input buffer switching control circuit 30.

The input buffer switching control circuit 30 includes inverters 51 to 55, NAND gates 56 and 57, NOR gates 58 and 59, and transmission gates 60 and 61. A clock signal clkz to be supplied to the input buffer switching control circuit 30 may be an internal clock signal corresponding to the clock signal CLK illustrated in FIG. 1. When the clock signal clkz is at a high level, the transmission gate 60 conducts and the transmission gate 61 becomes non-conductive. When the clock signal clkz is at a low level, the transmission gate 60 becomes non-conductive and the transmission gate 61 conducts.

The mode register setting signal mrspz may be generated in response to the leading edge of the clock signal clkz by the command control circuit 13. When the signal piflz from the mode register circuit 17-1 is switched, for example, when operation mode switching is instructed, the clock signal clkz to be supplied to the input buffer switching control circuit 30 is held at a high level.

When the signal piflz is held at a given level, the outputs from the NAND gate 56 and the inverter 55 are set at inverted levels of the level of the signal piflz. When the signal piflz is set at a high level, the high-voltage operation command signal ifvhz is set at a low level and the low-voltage operation command signal ifvlz is set at a high level, and hence the low-voltage operation mode is designated. When the signal piflz is set at a low level, the high-voltage operation command signal ifvhz is set at a high level and the low-voltage operation command signal ifvlz is set at a low level, and hence the high-voltage operation mode is designated.

When the signal piflz is switched from the given level to its inverted level, the clock signal clkz is set at a high level and the transmission gate 61 becomes non-conductive. Thus, the output from the NAND gate 56 may become different from the output from the inverter 55. Therefore, when the clock signal clkz holds a high pulse while the level of the signal piflz is being switched, the high-voltage operation command signal ifvhz and the low-voltage operation command signal ifvlz are set at a high level. As a result, the high-voltage operation command signal ifvhz and the low-voltage operation command signal ifvlz are contemporaneously asserted, for example, for a ½ cycle of the clock signal CLK, when being switched from the high-voltage operation mode to the low-voltage operation mode.

Figure 5:
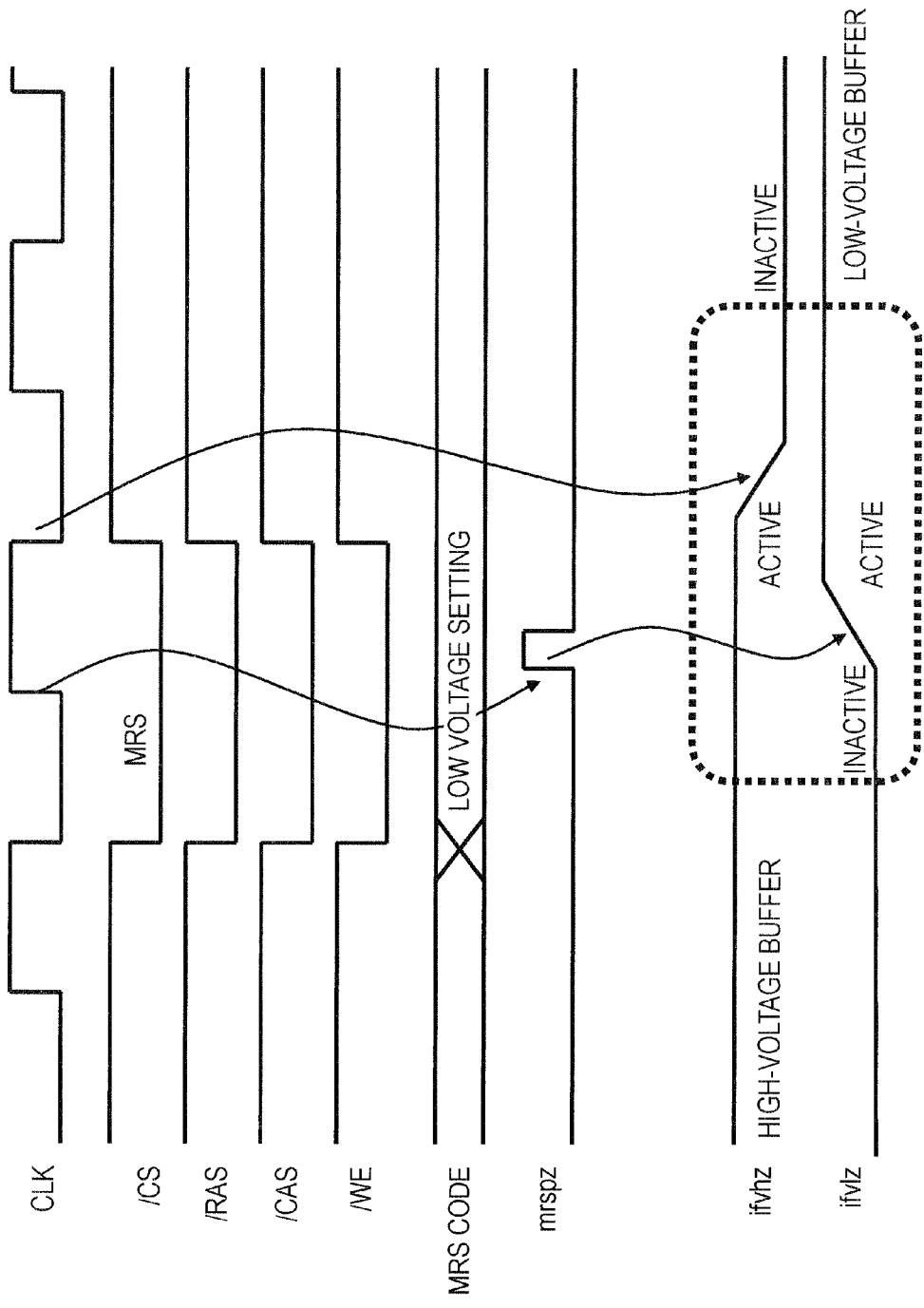
FIG. 5 illustrates an exemplary operation mode switching.

FIG. 5 illustrates an exemplary operation mode switching. The input buffer switching control circuit 30 illustrated in FIG. 4 may perform the operation mode switching illustrated in FIG. 5. In the example illustrated in FIG. 5, the operation mode is switched from the high-voltage operation mode to the low-voltage operation mode. The register setting command MRS is set by setting the control signals /CS, /RAS, /CAS and /WE at a low level. When the register setting command MRS is supplied to the control circuit and an MRS code is designated based on the address signal, a low-voltage operation is performed. The mode register setting signal mrspz from the command control circuit 13 is asserted in synchronization with the leading edge of the clock signal CLK in response to input of the register setting command MRS. In response to assertion of the mode register setting signal mrspz, the low-voltage operation command signal ifvlz shifts from a low level to a high level. The high-voltage operation command signal ifvhz is held at a high level. When the clock signal CLK is set at a low level, the high-voltage operation command signal ifvhz changes from a high level to a low level.

Figure 6:
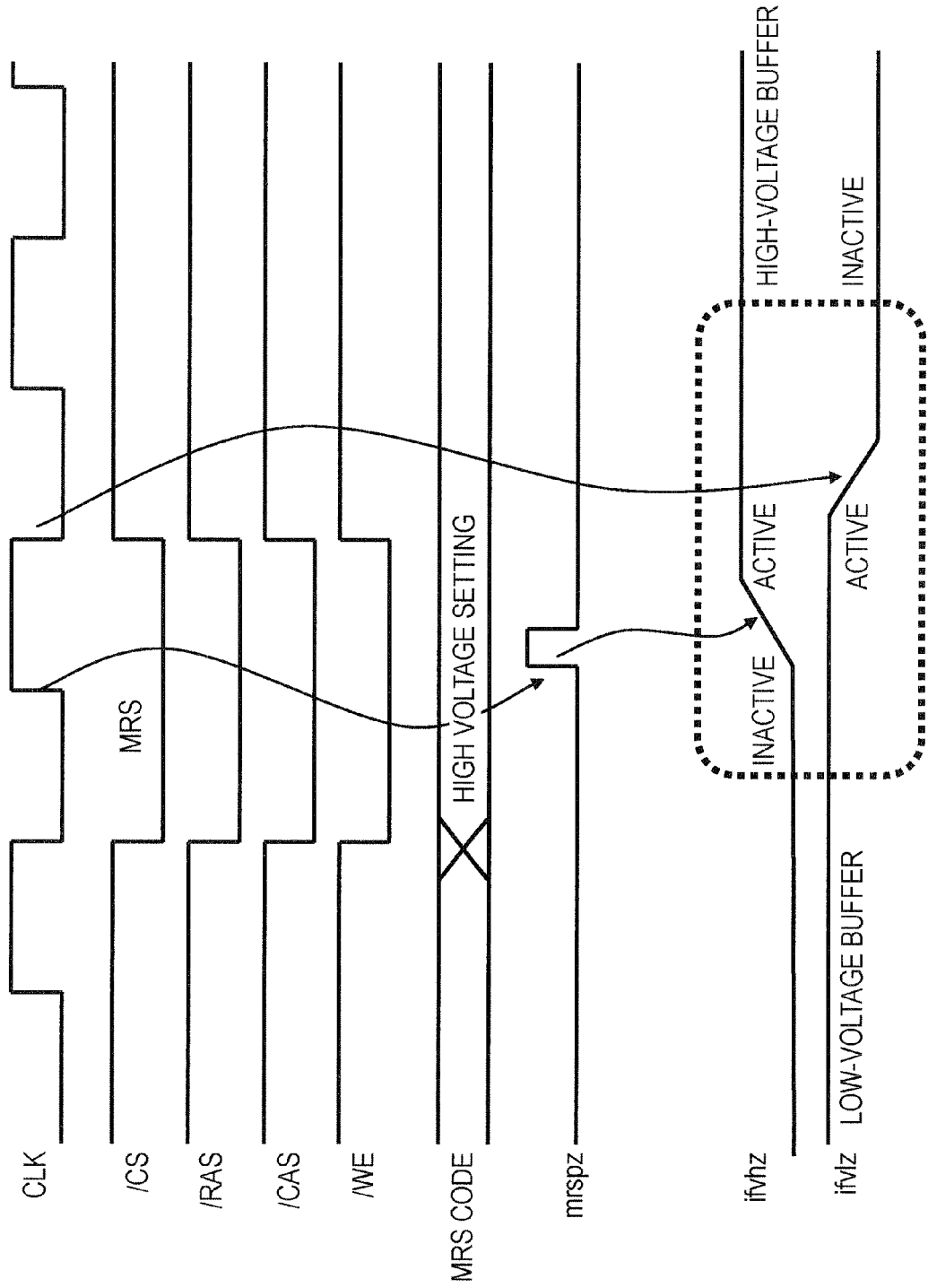
FIG. 6 illustrates an exemplary operation mode switching.

FIG. 6 illustrates an exemplary operation mode switching. The input buffer switching control circuit 30 illustrated in FIG. 4 may perform operation mode switching illustrated in FIG. 6. In FIG. 6, the operation mode is switched from the low-voltage operation mode to the high-voltage operation mode. The control signals may be set as illustrated in FIG. 5. In response to assertion of the mode register setting signal mrspz, the high-voltage operation command signal ifvhz shifts from a low level to a high level. The low-voltage operation command signal ifvlz is held at a high level. When the clock signal CLK is set at a low level, the low-voltage operation command signal ifvlz changes from a high level to a low level.

The input buffer switching control circuit 30 prepares a time period when the high-voltage operation command signal ifvhz and the low-voltage operation command signal ifvlz are contemporaneously asserted. When switching from the high-voltage operation mode to the low-voltage operation mode, the output signal iorz is set based on a signal from the input terminal 28 and hence the internal circuit will not malfunction.

In FIG. 3, when the high-voltage buffer 31 is switched to the low-voltage buffer 32, the output signal iorz which is not derived from the input signal of the input terminal 28 is output. Thus, when the low-voltage operation mode is switched to the high-voltage operation mode as illustrated in FIG. 6, the high-voltage operation command signal ifvhz and the low-voltage operation command signal ifvlz may not be contemporaneously asserted. However, when the low-voltage operation mode is switched to the high-voltage operation mode and when the high-voltage operation mode is switched to the low-voltage operation mode, the high-voltage operation command signal ifvhz and the low-voltage operation command signal ifvlz may be contemporaneously asserted.

Figure 7:
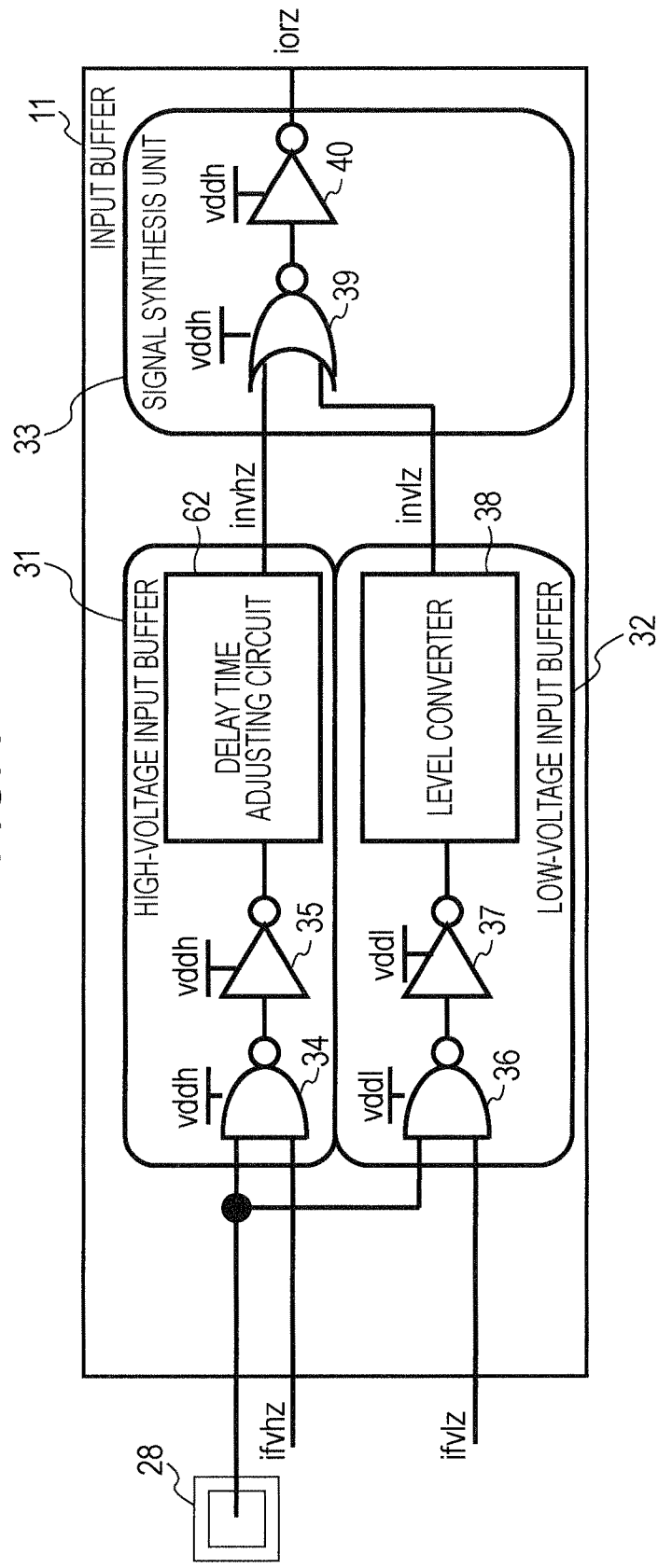
FIG. 7 illustrates an exemplary input buffer.

FIG. 7 illustrates an exemplary input buffer. The input buffer illustrated in FIG. 7 may be the input buffer 11 illustrated in FIG. 1 or 2. In FIG. 7, the same numerals are assigned to the same elements as those illustrated in FIG. 3 and description thereof will be omitted or reduced. The high-voltage input buffer 31 included in the input buffer 11 illustrated in FIG. 7 includes a delay time adjusting circuit 62. The delay time adjusting circuit 62 gives a delay time which is substantially the same as the delay time of the level converter 38 to a signal path on the side of the high-voltage input buffer 31. Due to the delay time given by the delay time adjusting circuit 62, a timing at which a signal is output from the high-voltage buffer 31 is made substantially the same as a timing at which a signal is output from the low-voltage buffer 32. For example, due to variations in processes and temperature change, the delay time of the delay time adjusting circuit 62 may become different from the delay time of the level converter 38. One of the delay time of the delay time adjusting circuit 62 and the delay time of the level converter 38 may become longer than the other. Therefore, it is desirable that the high-voltage operation command signal ifvhz and the low-voltage operation command signal ifvlz are contemporaneously asserted when being switched from the low-voltage operation mode to the high-voltage operation mode and from the high-voltage operation mode to the low-voltage operation mode.

Figure 8:
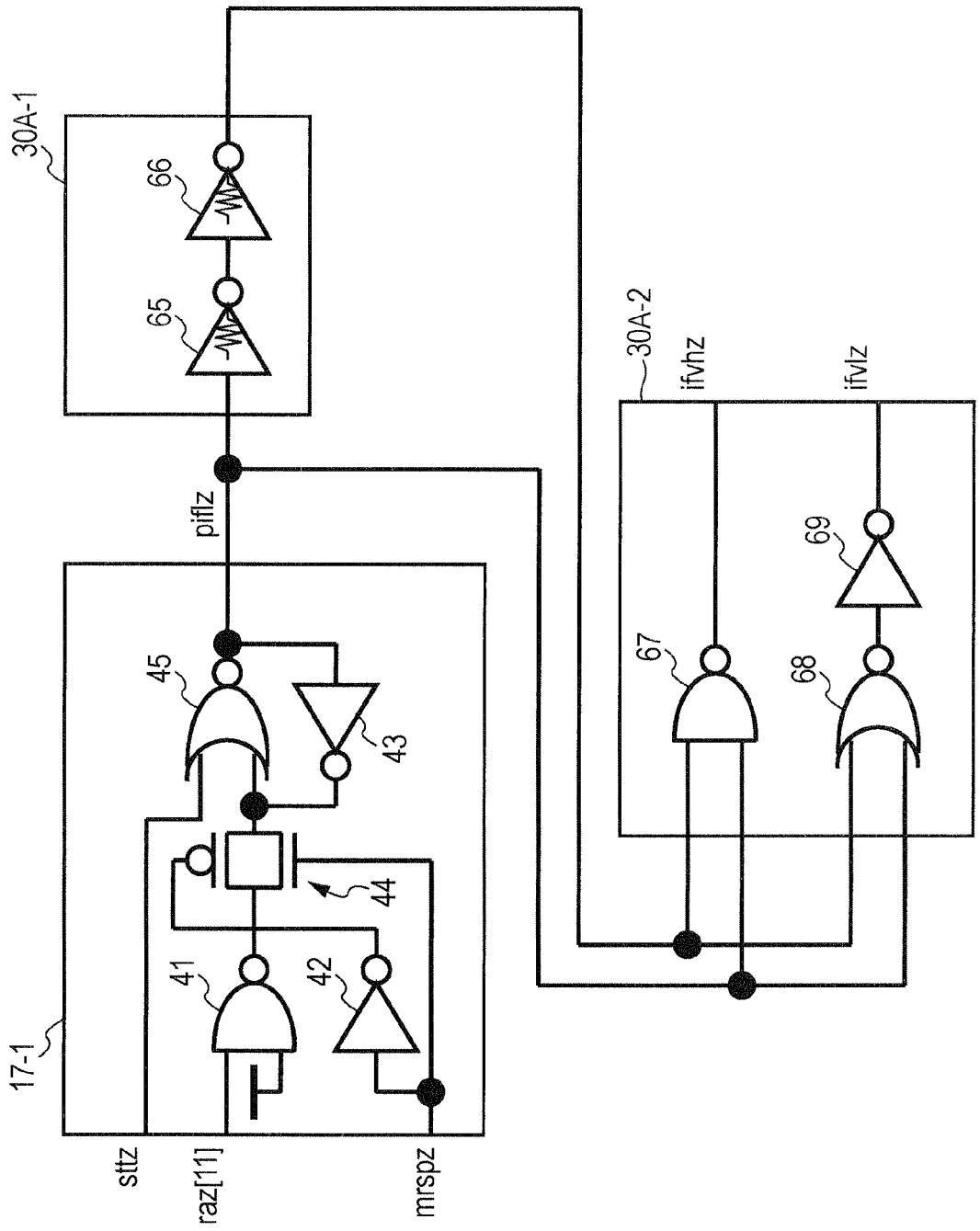
FIG. 8 illustrates an exemplary input buffer switching control circuit.

FIG. 8 shows an exemplary input buffer switching control circuit. The input buffer switching control circuit illustrated in FIG. 8 may be the input buffer switching control circuit 30 illustrated in FIG. 2. In FIG. 8, at least part of the mode register 17 that generates the signal piflz to be supplied to the input buffer switching control circuit is also illustrated. A semiconductor storage device including an asynchronous input interface may include the input buffer switching control circuit illustrated in FIG. 8. In FIG. 8, the same numerals are assigned to the same elements as those in illustrated in FIG. 4 and description thereof will be omitted or reduced.

The input buffer switching control circuit includes a delay circuit 30A-1 and a logical circuit 30A-2. The delay circuit 30A-1 includes inverter delay elements 65 and 66. The logical circuit 30A-2 includes a NAND gate 67, an NOR gate 68 and an inverter 69. When the signal piflz is set at a given level, the signal piflz which is input from the mode register circuit 17-1 into the logical circuit 30A-2 and a delayed signal piflz which is input from the delay circuit 30A-1 into the logical circuit 30A-2 may be at the same level. For example, when the signal piflz is set at a high level, the high-voltage operation command signal ifvhz is set at a low level and the low-voltage operation command signal ifvlz is set at a high level. In this manner, the low-voltage operation mode is designated. For example, when the signal piflz is set at a low level, the high-voltage operation command signal ifvhz is set at a high level and the low-voltage operation command signal ifvlz is set at a low level. In this manner, the high-voltage operation mode is designated.

When the signal pilfz is switched from a certain level to its inverted level, the signal piflz which is input from the mode register circuit 17-1 into the logical circuit 30A-2 and the delayed signal piflz output from the delay circuit 30A-1 may become different from each other. Upon switching the level of the signal piflz, for example, the high-voltage operation command signal ifvhz and the low-voltage operation command signal ifvlz are set at a high level for a given time period corresponding to the delay time of the delay circuit 30A-1. Upon mode switching between the high-voltage operation mode and the low-voltage operation mode, the high-voltage operation command signal ifvhz and the low-voltage operation command signal ifvlz are contemporaneously asserted.

Figure 9:
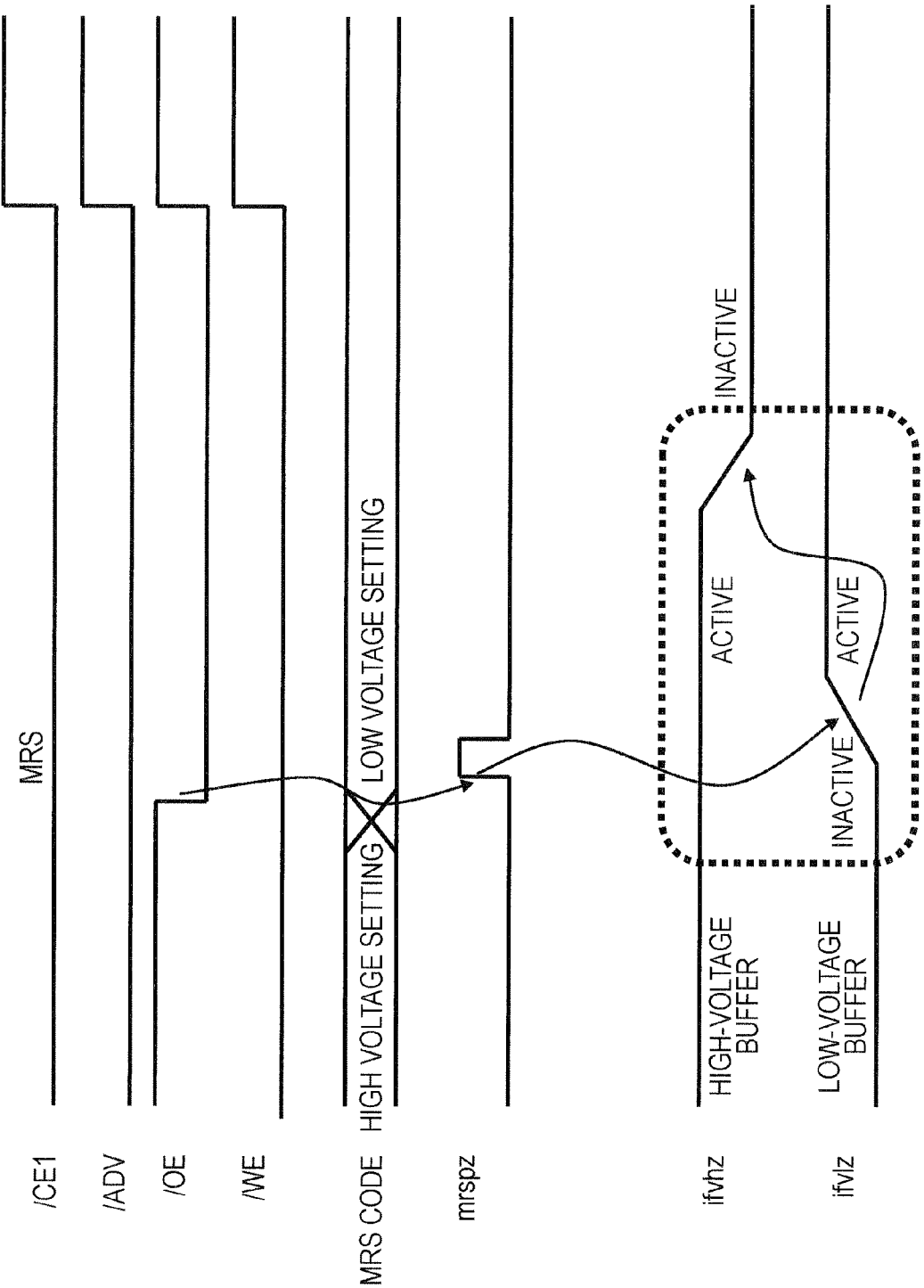
FIG. 9 illustrates an exemplary operation mode switching.

FIG. 9 illustrates an exemplary operation mode switching. The input buffer switching control circuit illustrated in FIG. 8 may perform the operation mode switching illustrated in FIG. 9. In the example illustrated in FIG. 9, for example, the operation mode of a semiconductor storage device such as a pseudo-SRAM including an asynchronous input interface is switched from the high-voltage operation mode to the low-voltage operation mode. For example, the register setting command MRS is set by setting control signals /CE1, /ADV, /OE and /WE at a low level. The register setting command signal MRS is supplied to the control circuit and an MRS code is designated in accordance with an address signal, thereby performing the low-voltage operation. The mode register setting signal mrspz to be output from the command control circuit 13 is asserted in synchronization with the trailing edge of the output enable signal /OE, in response to input of the register setting command signal MRS. The low-voltage operation command signal ifvlz shifts from a low level to a high level in response to assertion of the mode register setting signal mrspz. The high-voltage operation command signal ifvhz is held at a high level. After a given delay time elapses, the high-voltage operation command signal ifvhz changes from a high level to a low level.

Figure 10:
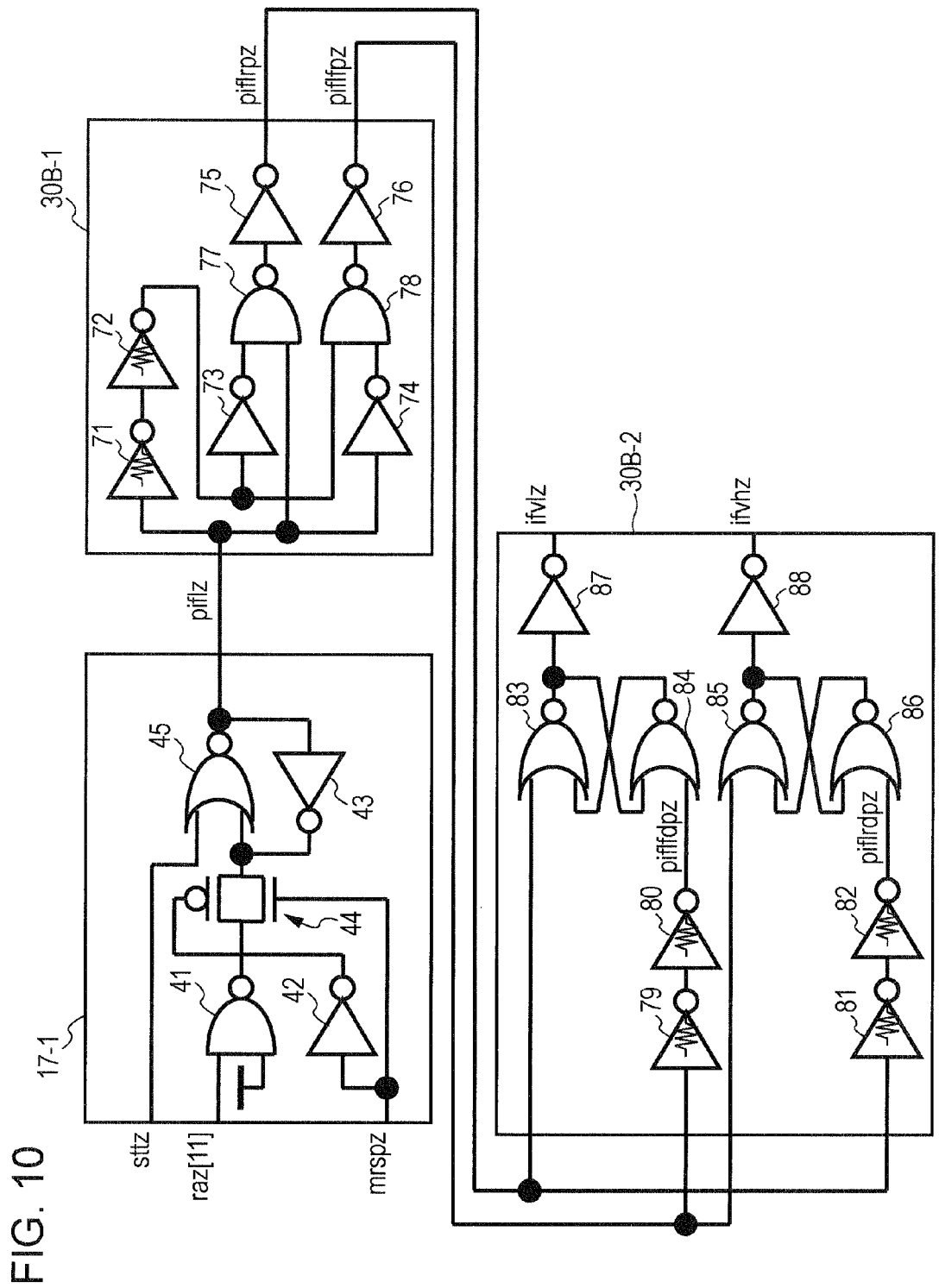
FIG. 10 illustrates an exemplary switching control circuit.

FIG. 10 illustrates an exemplary input buffer switching control circuit. The input buffer switching control circuit illustrated in FIG. 10 may be the input buffer switching control circuit 30 illustrated in FIG. 2. In FIG. 10, at least part of the mode register 17 that generates the signal piflz to be supplied to the input buffer switching control circuit is illustrated. A semiconductor storage device including an asynchronous input interface may include the input buffer switching control circuit illustrated in FIG. 10. In FIG. 10, the same numerals are assigned to the same elements as those in FIG. 4 and description thereof will be omitted or reduced.

The input buffer switching control circuit includes a pulse generation circuit 30B-1 and a flip-flop circuit 30B-2. The pulse generation circuit 30B-1 includes inverter delay elements 71 and 72, inverters 73 to 76 and NAND gates 77 and 78. When the signal piflz is set at a given level, signals piflrpz and piflfpz may be set at a low level regardless of the level of the signal piflz. When the level of the signal piflz changes from a low level to a high level, the signal piflrpz holds a high pulse. When the level of the signal piflz changes from a high level to a low level, the signal piflfpz holds a high pulse. The HIGH pulse of the signal piflrpz or piflfpz is supplied to the flip-flop circuit 30B-2.

The flip-flop circuit 30B-2 includes inverter delay elements 79 to 82, NOR gates 83 to 86 and inverters 87 and 88. When the HIGH-pulse-held signal piflrpz is supplied, a flip-flop including the NOR gates 83 and 84 is set and hence the low-voltage operation command signal ifvlz is set at a high level. After a given delay time elapses, a flip-flop including the NOR gates 85 and 86 is reset based on a signal piflrdpz and the high-voltage operation command signal ifvhz is set at a low level. When the high-pulse signal piflfpz is supplied, the flip-flop including the NOR gates 85 and 86 is set and hence the high-voltage operation command signal ifvhz is set at a high level. After a given delay time elapses, the flip-flop including the NOR gates 83 and 84 is reset based on a signal piflfdpz and the low-voltage operation command signal ifvlz is set at a low level.

Figure 11:
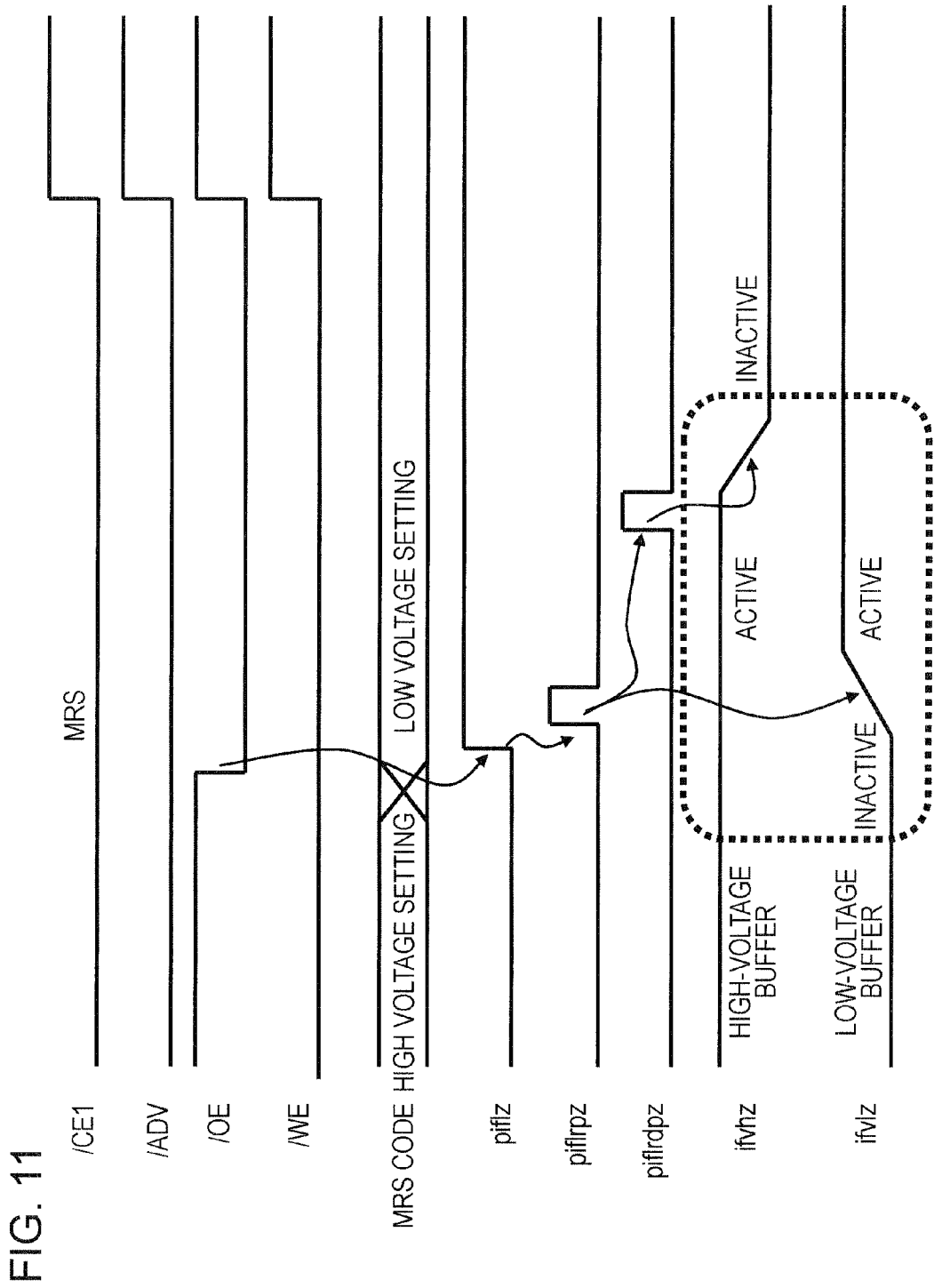
FIG. 11 illustrates an exemplary operation mode switching.

FIG. 11 illustrates an exemplary operation mode switching. The input buffer switching control circuit illustrated in FIG. 10 may perform the operation mode switching illustrated in FIG. 11. The operation mode of a semiconductor storage device such as a pseudo-SRAM including an asynchronous input interface is switched from the high-voltage operation mode to the low-voltage operation mode. The register setting command signal MRS is set by setting the control signals /CE1, /ADV, /OE and /WE at a low level. The register setting command signal MRS is supplied to the input buffer switching control circuit and an MRS code is designated in accordance with an address signal, thereby performing the low-voltage operation. The mode register setting signal mrspz is asserted in response to the trailing edge of the output enable signal /OE upon input of the register setting command signal MRS and hence the signal piflz changes from a low level to a high level. The signal piflrpz holds a high pulse in accordance with change of the signal piflz from a low level LOW to a high level. The low-voltage operation command signal ifvlz shifts from a low level to a high level in response to the high pulse of the signal piflrpz. The high-voltage operation command signal ifvhz is held at a high level. After a given delay time elapses, the high-voltage operation command signal ifvhz changes from a high level to a low level based on the HIGH pulse of the signal piflrdpz.

Figure 12:
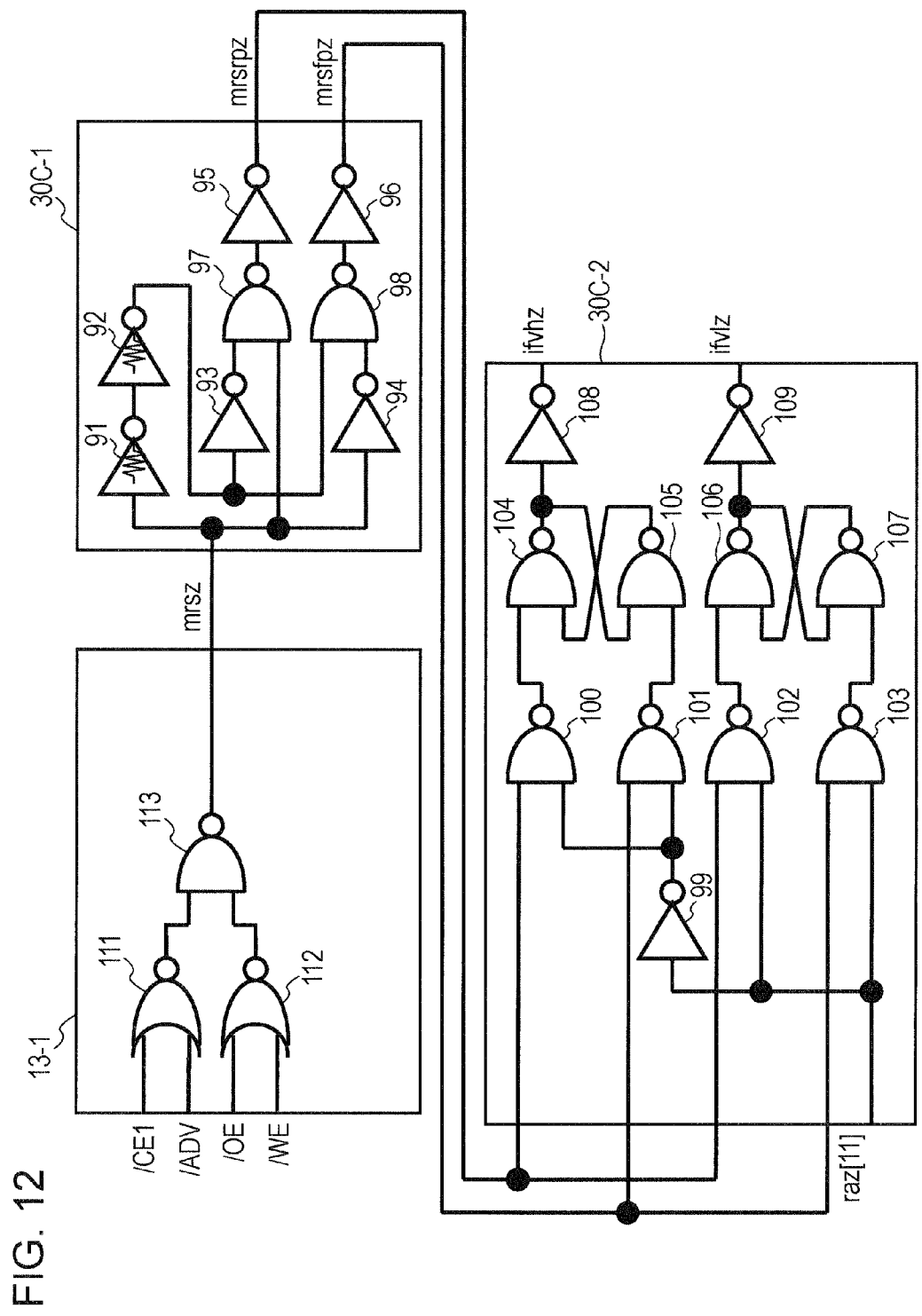
FIG. 12 illustrates an exemplary an input buffer switching control circuit.

FIG. 12 illustrates an exemplary input buffer switching control circuit. The input buffer switching control circuit illustrated in FIG. 12 may be the input buffer switching control circuit 30 illustrated in FIG. 2. In FIG. 12, the operation mode of a semiconductor storage device including an asynchronous input interface is switched between the high-voltage operation and the low-voltage operation based on a decode output signal from the command control circuit.

A command decoding circuit 13-1 of the command control circuit includes NOR gates 111 and 112 and a NAND gate 113. The command decode circuit 13-1 sets the signal mrsz at a low level when the control signals /CE1, /ADV, /OE and /WE are set at a low level.

The input buffer switching control circuit includes a pulse generation circuit 30C-1 and a flip-flop circuit 30C-2. The pulse generation circuit 30C-1 includes inverter delay elements 91 and 92, inverters 93 to 96 and NAND gates 97 and 98. For example, when the signal mrsz does not change, signals mrsrpz and mrsfpz are set a low level regardless of the level of the signal mrsz. When the signal mrsz changes from a high level to a low level, the signal mrsfpz has a high pulse. When the signal mrsz changes from a low level to a high level, the signal mrsrpz has a high pulse. The high pulse of the signal mrsrpz or mrsfpz is supplied to the flip-flop circuit 30C-2.

The flip-flop circuit 30C-2 includes an inverter 99, NAND gates 100 to 107, and inverters 108 and 109. When the high-pulse signal mrsfpz is supplied, the signal ifvhz or ifvlz is set at a high level in accordance with the signal raz[11]. When the high-pulse signal mrsrpz is supplied, the signal ifvhz or ifvlz is set at a low level.

Figure 13:
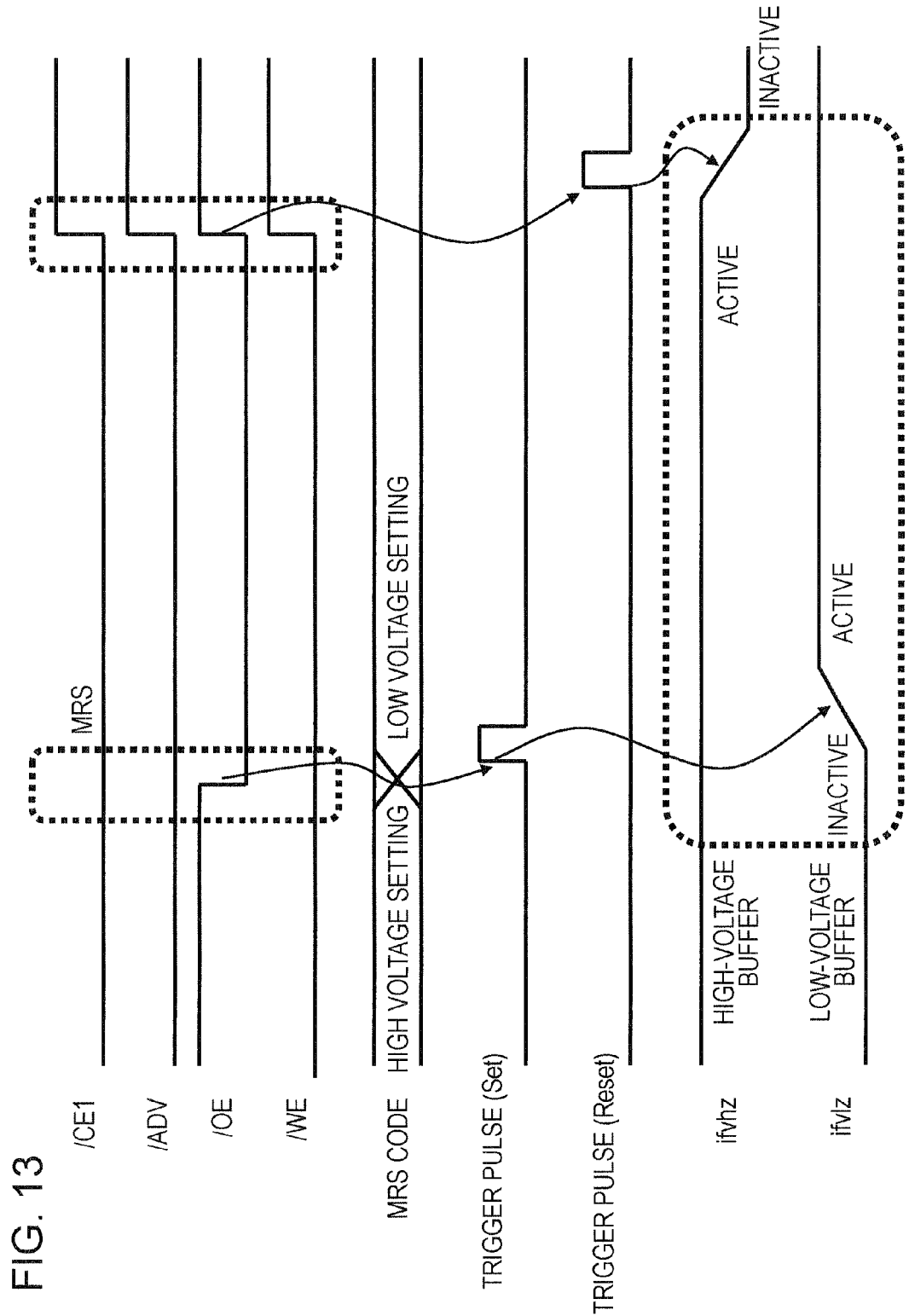
FIG. 13 illustrates an exemplary operation mode switching.

FIG. 13 illustrates an exemplary operation mode switching. The input buffer switching control circuit illustrated in FIG. 12 may perform the operation mode switching illustrated in FIG. 13. In FIG. 13, the operation mode of a semiconductor storage device such as a pseudo-SRAM including an asynchronous input interface is switched from the high-voltage operation mode to the low-voltage operation mode. The register setting command signal MRS is set by setting the control signals /CE1, /ADV, /OE and /WE at a low level. The register setting command signal MRS is supplied to the input buffer switching control circuit and a high set trigger pulse is generated. The set trigger pulse may correspond to the high pulse of the signal mrsfpz illustrated in FIG. 12. In response to the set trigger pulse, the low-voltage operation command signal ifvlz shifts from a low level to a high level. The high-voltage operation command signal ifvhz is held at a high level. When at least one of the control signals /CE1, /ADV, /OE and /WE is set at a high level, a HIGH reset trigger pulse is generated. The reset trigger pulse may correspond to the high pulse of the signal mrsrpz illustrated in FIG. 12. In response to the reset trigger pulse, the high-voltage operation command signal ifvhz changes from a high level to a low level.

Figure 14:
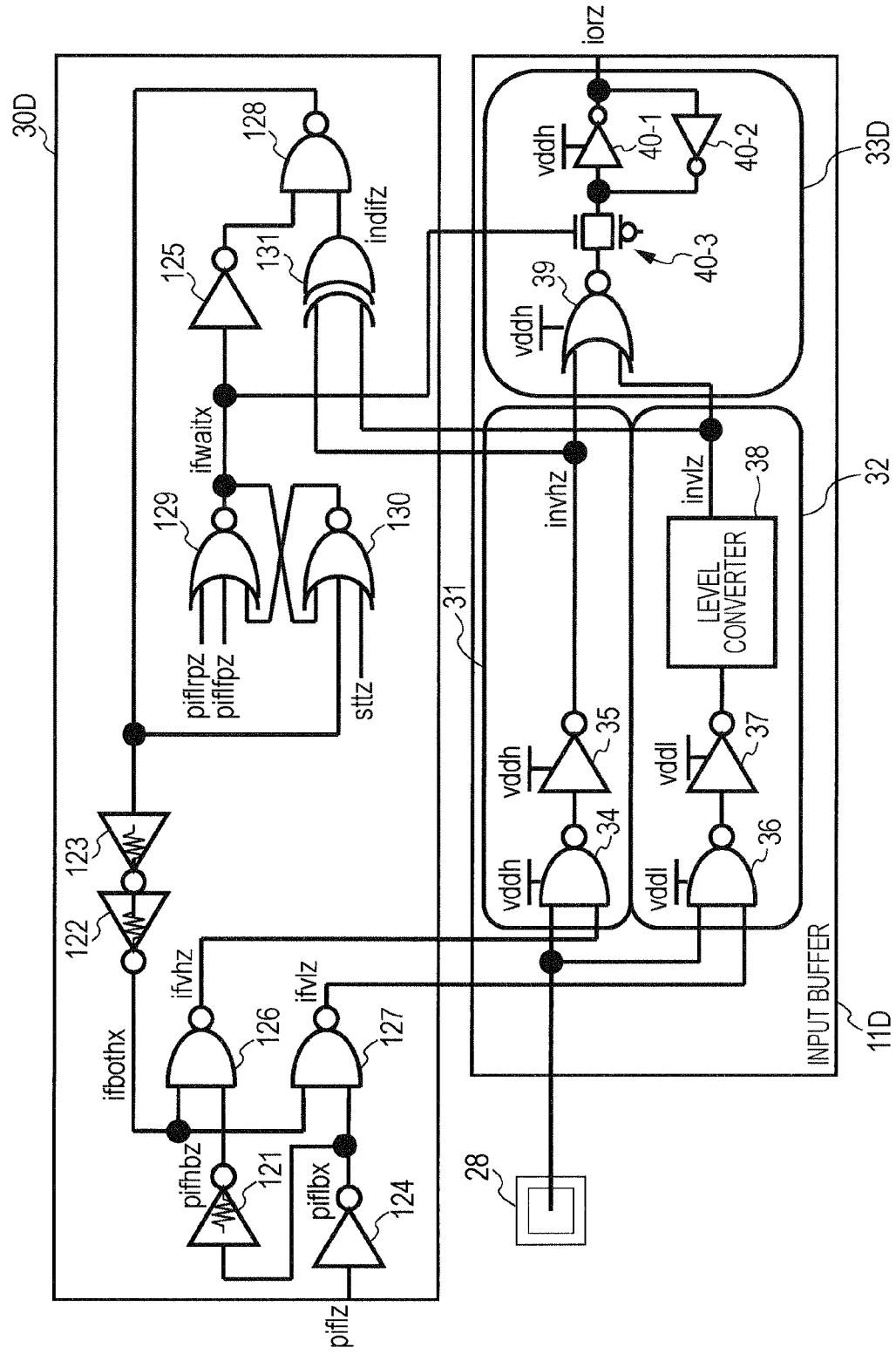
FIG. 14 illustrates an exemplary input buffer switching control circuit.

FIG. 14 illustrates an exemplary input buffer switching control circuit. The input buffer switching control circuit illustrated in FIG. 14 may be the input buffer switching control circuit 30 illustrated in FIG. 2. In FIG. 14, an input buffer 11D which is controlled by the input buffer switching control circuit is also illustrated. In FIG. 14, the same numerals are assigned to the same elements as those illustrated in FIG. 3 and description thereof will be omitted or reduced.

An input buffer switching control circuit 30D includes inverter delay elements 121 to 123, inverters 124 and 125, NAND gates 126 to 128, NOR gates 129 and 130, and an EXOR gate 131. The input buffer 11D includes a signal synthesis unit 33D. The input buffer 11D may correspond to the signal synthesis unit 33 illustrated in FIG. 3. The signal synthesis unit 33D includes an NOR gate 39, inverters 40-1 and 40-2, and a transmission gate 40-3. Upon operation mode switching, the transmission gate 40-3 is cut off and the signal iorz, which indicates that switching is not yet performed and is be stored in a latch including the inverters 40-1 and 40-2, is held. Whether the output invhz from the high-voltage buffer 31 is substantially the same as the output invlz from the low-voltage buffer 32 or not is judged and when judging that they are substantially the same, the transmission gate 40-3 conducts. Any signal iorz which is not derived from a signal at the input terminal 28 may not be output.

Figure 15:
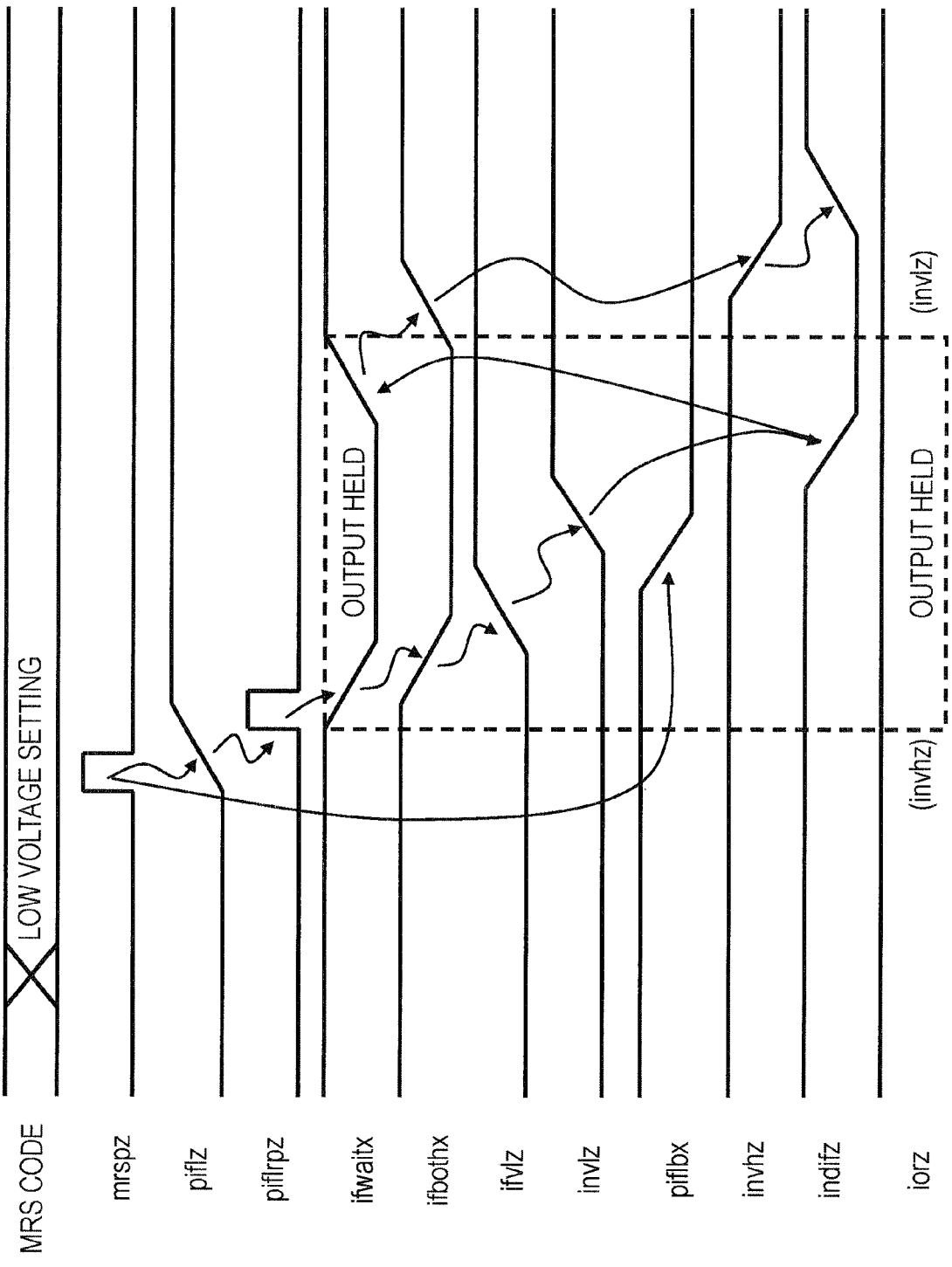
FIG. 15 illustrates an exemplary operation mode switching.

FIG. 15 illustrates an exemplary operation mode switching. The operation mode switching illustrated in FIG. 15 may be performed by the input buffer switching control circuit illustrated in FIG. 14. In FIG. 15, the high-voltage operation mode is switched to the low-voltage operation mode. The register setting command signal MRS is input and an MRS code is designated in accordance with an address signal, thereby setting the low-voltage operation mode. The signal piflz, which is generated, for example, by the mode register circuit 17-1 illustrated in FIG. 10 in accordance with assertion of the mode register setting signal mrspz, changes from a low level to a high level. In response to change of the signal piflz from a low level to a high level, a signal piflrpz having a high pulse is generated, for example, by the pulse generation circuit 30B-1 illustrated in FIG. 10. In response to the high pulse of the signal piflrpz, a latch including, for example, the NOR gates 129 and 130 illustrated in FIG. 14 is set and a signal ifwaitx is set at a low level as illustrated in FIG. 15. When the signal ifwaitx is set at a low level, the transmission gate 40-3 becomes non-conductive and the signal iorz, which indicates that switching is not yet performed and is to be stored in the latch including the inverters 40-1 and 40-2, is held.

A signal ifbothx is set at a low level and the low-voltage operation command signal ifvlz is set at a high level based on the signal ifwaitx which is set at a low level. The high-voltage operation command signal ifvhz is held at the high level indicating that switching is not yet performed. A signal invlz is set at an effective level, for example, a high level based on activation of the low-voltage buffer 32. An output signal invhz from the high-voltage buffer 31 and an output signal inlhz from the low-voltage buffer 32 are set at a high level and an output signal indifz from the EXOR gate 131 is set at a low level. In response to the output indifz which is set at a low level, a latch including the NOR gates 129 and 130 is reset and hence the signal ifwaitx is set at a high level. When the signal ifwaitx is set at a high level, the transmission gate 40-3 conducts and the signal iorz is updated to a value indicating that switching has been performed based on the output signal inlhz from the low-voltage buffer 32. In response to the output signal indifz which is set at a low level, the signal ifbothx is set at a high level, the high-voltage operation command signal ifvhz is set at a low level and the low-voltage operation command signal ifvlz is set at a high level.

Whether the output signal invhz from the high-voltage buffer 31 and the output signal invlz from the low-voltage buffer 32 have reached substantially the same level or not is judged and when judging that they have reached substantially the same level, the signal iorz is set at a signal indicating that switching has been performed. Any signal iorz which is not derived from a signal at the input terminal 28 may not be output.

Figure 16:
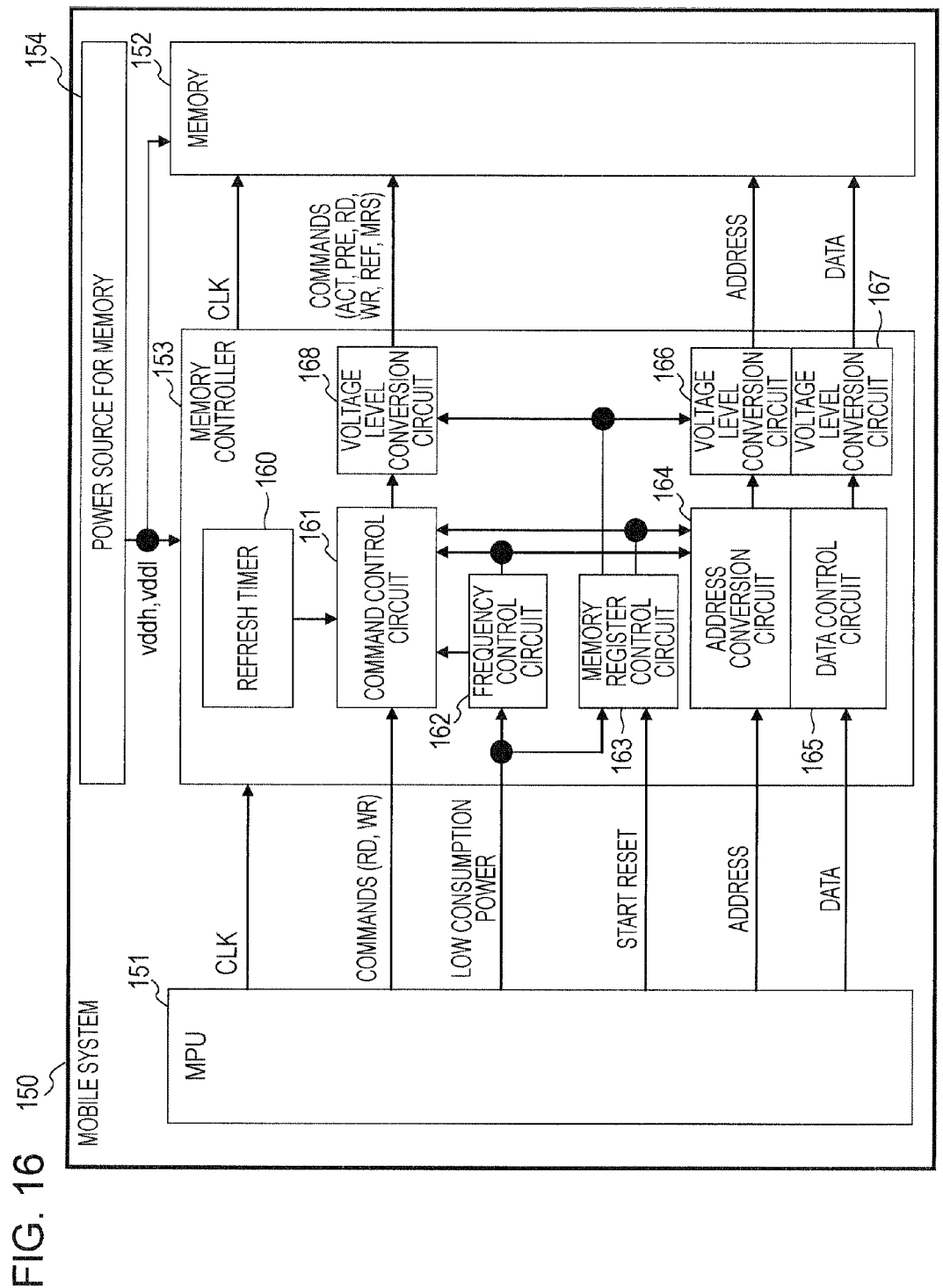
FIG. 16 illustrates an exemplary system.

FIG. 16 illustrates an exemplary system. The system illustrated in FIG. 16 may include a semiconductor device where the input buffers illustrated in FIG. 1 may be switched. The system illustrated in FIG. 16 may be applied to, for example, a mobile system (a mobile phone). However, the system is not limited to the mobile system.

A system 150 includes an MPU 151 that controls the system, a memory 152 that stores data and a memory controller 153 that relays exchange of data between the MPU 151 and the memory 152. The system 150 also includes a power source 154 for the memory that supplies power to the memory 152 and the memory controller 153. The memory controller 153 includes a refresh timer 160, a command control circuit 161, a frequency control circuit 162, a memory register control circuit 163, an address conversion circuit 164, a data control circuit 165 and voltage level conversion circuits 166 to 168. The refresh timer 160 may be a timer that refreshes the memory 152. The command control circuit 161 converts the format of a read command RD or a write command WR from the MPU 151 to a format suitable for an interface of the memory 152. The address conversion circuit 164 and the data control circuit 165 adjust addresses and data conforming to the latency of the memory 152. The memory register control circuit 163 controls the memory 152.

Vddh is the power source for a high-voltage and high-speed operation and vddl is the power source for a low consumption current operation. The MPU 151 supplies the read command RD or the write command WR and an address used to read data from or write data into the memory 152 to the memory controller 153. The MPU 151 also supplies a start reset instruction for initializing the memory 152 when the power source is turned on and an instruction for designating the low consumption current operation to the memory controller 153. The memory register control circuit 163 generates a command and an address used for initializing the mode register of the memory 152 based on the start reset signal sent from the MPU 151. The memory register control circuit 163 generates a command and an address for setting the mode register of the memory 152 in the low-voltage operation mode based on the instruction for designating the low consumption current operation sent from the MPU 151. The memory register control circuit 163 controls the voltage level conversion circuits 166 to 168 in order to use the low voltage source. The frequency control circuit 162 adjusts the latency to a later side based on the instruction for designating the low consumption current operation sent from the MPU 151 such that commands, addresses or data are transmitted to and received from the memory 152 at appropriate timings.

Figure 17:
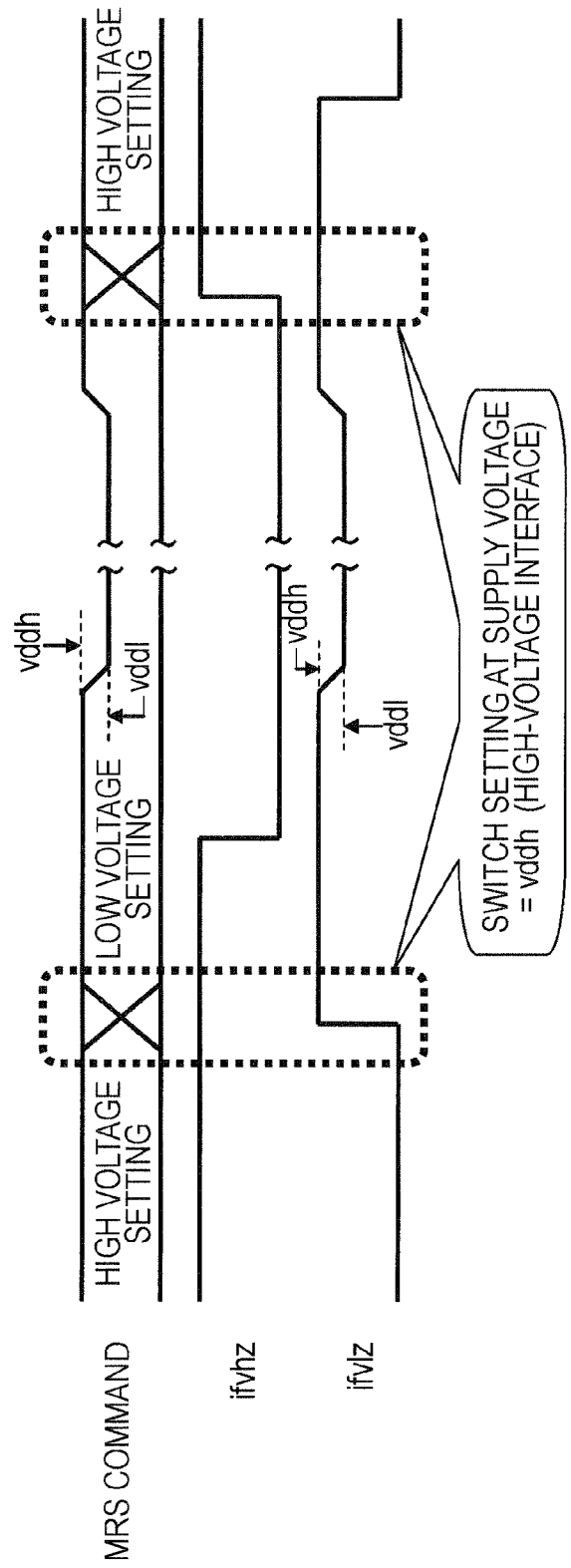
FIG. 17 illustrates an exemplary signal voltage adjustment.

FIG. 17 illustrates an exemplary signal voltage adjustment. The signal voltage adjustment illustrated in FIG. 17 may be performed by the system illustrated in FIG. 16. In FIG. 17, the operation mode is switched from the high-voltage operation mode to the low-voltage operation mode and then is returned to the high-voltage operation mode. After the high-voltage operation mode is switched to the low-voltage operation mode based on the command MRS, signals to be supplied to the memory are driven at the high voltage vddh for a while. When a given time period elapses after the operation mode shifts to the low-voltage operation mode, the supply voltage is switched to the low supply voltage and signals to be supplied to the memory are driven at the low voltage vddl. When the operation mode is switched from the low-voltage operation mode to the high-voltage operation mode based on the command MRS, the voltage which drives the signals to be supplied to the memory is switched in advance from the low voltage vddl to the high voltage vddh. When a given time period elapses after the voltage is switched to the high voltage vddh, the operation mode is switched from the low-voltage operation mode to the high-voltage operation mode based on the command MRS. When the high-voltage input buffer is operated in the operation mode shifting, since the signal corresponding to the high level of the input signal which is driven by the low supply voltage is at a low voltage, the signal may not be erroneously detected as a low level signal.

FIG. 18 illustrates an exemplary signal voltage adjustment and an exemplary operation mode switching. In operation S1, the voltage of an input signal to be supplied to the memory is set at a detection level of a high-voltage input buffer. The signal is driven at the voltage vddh. In operation S2, voltage operation mode setting is programmed based on an input buffer switching command. A mode register setting command is supplied to the memory so as to switch between a high-voltage input buffer and a low-voltage input buffer. In operation S3, the high-voltage input buffer and the low-voltage input buffer are activated. In operation S4, after the input buffers have been activated for a given time period, the input buffer which has been judged not to be used after switching is inactivated.

In operation S5, after switching by the mode register setting command, whether a low-voltage interface is used or not is judged. That is, whether the input buffer used after switching is the low-voltage input buffer or not is judged. When the low-voltage input buffer is used, operation S6 is executed. While, when the low-voltage input buffer is not used, operation S6 is skipped. In operation S6, the voltage of the signal to be supplied to the memory is set at a detection level for the low-voltage input buffer. The input signal is driven at the voltage vddl.

When switching a high-voltage input buffer and a low-voltage input buffer, the input signal is driven at the high driving voltage vddh such that the detection result of the input signal of the high-voltage input buffer becomes substantially the same as the detection result of the input signal of the low-voltage input buffer. Therefore, malfunctions induced by a difference in characteristics between an input buffer used before switching and an input buffer used after switching may not occur.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor device comprising:
  a first input circuit to which a first supply voltage is supplied;
  a second input circuit to which a second supply voltage that is lower than the first supply voltage is supplied; and
  a control circuit configured to activate the first input circuit in a first mode and configured to activate the second input circuit in a second mode,
  wherein the control circuit controls the first input circuit and the second input circuit such that the first input circuit and the second input circuit are activated during a certain time period when switching between the first mode and the second mode, and a supply of a first control signal indicating activation of the first input circuit by the control circuit overlaps at least partially with a supply of a second control signal indicating activation of the second input circuit by the control circuit.

2. The semiconductor device according to claim 1, wherein a first control signal which is generated by the control circuit and controls the first input circuit and a second control signal which is generated by the control circuit and controls the second input circuit are independent of each other.

3. The semiconductor device according to claim 1, further comprising:
  a register configured to construct the control circuit to activate the first input circuit or the second input circuit.

4. The semiconductor device according to claim 3, wherein the register instructs the control circuit to activate the first input circuit or the second input circuit based on a command signal supplied from an outside source.

5. The semiconductor device according to claim 1, wherein the second input circuit includes a level conversion circuit configured to convert a level of an input signal to a level corresponding to the first supply voltage.

6. The semiconductor device according to claim 1, further comprising:
a synthesis circuit configured to synthesize an output from the first input circuit and an output from the second input circuit.

7. The semiconductor device according to claim 1, wherein the first input circuit and the second input circuit receive a command signal or a address signal.

8. A semiconductor device, comprising:
an internal circuit;
a first input circuit; and
a second input circuit,
wherein the first input circuit and the second input circuit are activated during a certain time period when switching between a first signal and a second signal, and
wherein an input signal is supplied to the internal circuit via one of the first input circuit and the second input circuit, the first input circuit operates at a first supply voltage and the second input circuit operates at a second input voltage which is lower than the first input voltage, and the first input circuit and the second input circuit are at least part of one of a synchronous interface circuit and an asynchronous interface circuit.

9. The semiconductor device according to claim 8, wherein a first time period where a first control signal which controls the first input circuit has a first level which instructs activation of the first input circuit and a second time period where a second control signal which controls the second input circuit has a second level which instructs activation of the second input circuit overlap at least partially.

10. The semiconductor device according to claim 8, wherein
the first input circuit or the second input circuit is controlled based on a command signal supplied from an outside source.

11. A system comprising:
a controller; and
a semiconductor device which is controlled based on a control signal from the controller, wherein
the semiconductor device includes:
a first input circuit to which a first supply voltage is supplied;
a second input circuit to which a second supply voltage that is lower than the first supply voltage is supplied; and
a control circuit configured to activate the first input circuit in a first mode and configured to activate the second input circuit in a second mode,
wherein the control circuit controls the first input circuit and the second input circuit such that the first input circuit and the second input circuit are activated during a certain time period when switching between the first mode and the second mode, and a supply of a first control signal indicating activation of the first input circuit by the control circuit overlaps at least partially with a supply of a second control signal indicating activation of the second input circuit by the control circuit.

12. The system according to claim 11, wherein
the control circuit generates a first control signal which instructs activation of the first input circuit and a second control signal which instructs activation of the second input circuit based on the control signal.

13. The system according to claim 11, wherein
the control circuit supplies a first control signal, which instructs activation of the first input circuit, and a second control signal, which instructs activation of the second input circuit, and supplies the first control signal to the first input circuit and the second control signal to the second input circuit together during the certain time period.

14. The system according to claim 11, wherein
the semiconductor device includes a semiconductor memory and the control signal includes a mode register setting command.

15. The system according to claim 11, wherein
the first input circuit and the second input circuit receive a command signal or a address signal from the controller.

16. The semiconductor device according to claim 1, wherein
the first input circuit and the second input circuit are at least part of one of a synchronous interface circuit and an asynchronous interface circuit.

17. The system according to claim 11, wherein
the first input circuit and the second input circuit are at least part of one of a synchronous interface circuit and an asynchronous interface circuit.

* * * * *